(12) United States Patent
Lee

(10) Patent No.: US 7,867,822 B2
(45) Date of Patent: Jan. 11, 2011

(54) SEMICONDUCTOR MEMORY DEVICE

(76) Inventor: Sang-Yun Lee, 17082 NW. Elk Run Dr., Beaverton, OR (US) 97006

( * ) Notice: Subject to any disclaimer, the term of this patent is extended or adjusted under 35 U.S.C. 154(b) by 0 days.

(21) Appl. No.: 12/618,542

(22) Filed: Nov. 13, 2009

(65) Prior Publication Data

US 2010/0112753 A1    May 6, 2010

Related U.S. Application Data

(63) Continuation-in-part of application No. 12/040,642, filed on Feb. 29, 2008, now Pat. No. 7,800,199, and a continuation-in-part of application No. 11/092,498, filed on Mar. 29, 2005, now Pat. No. 7,470,142, and a continuation-in-part of application No. 11/092,499, filed on Mar. 29, 2005, now Pat. No. 7,470,598, and a continuation-in-part of application No. 11/092,500, filed on Mar. 29, 2005, and a continuation-in-part of application No. 11/092,501, filed on Mar. 29, 2005, and a continuation-in-part of application No. 11/092,521, filed on Mar. 29, 2005, now Pat. No. 7,633,162, and a continuation-in-part of application No. 11/180,286, filed on Jul. 12, 2005, and a continuation-in-part of application No. 11/378,059, filed on Mar. 17, 2006, and a continuation-in-part of application No. 11/606,523, filed on Nov. 30, 2006, and a continuation-in-part of application No. 10/873,969, filed on Jun. 21, 2004, now Pat. No. 7,052,941, and a continuation-in-part of application No. 11/873,719, filed on Oct. 17, 2007, and a continuation-in-part of application No. 11/873,851, filed on Oct. 17, 2007, now Pat. No. 7,718,508, and a continuation-in-part of application No. 11/873,769, filed on Oct. 17, 2007.

(30) Foreign Application Priority Data

| Jun. 24, 2003 | (KR) | ................. 10-2003-0040920 |
|---|---|---|
| Jul. 12, 2003 | (KR) | ................. 10-2003-0047515 |
| May 21, 2008 | (KR) | ................. 10-2008-0046991 |
| May 30, 2008 | (KR) | ................. 10-2008-0050946 |
| Oct. 14, 2008 | (KR) | ................. 10-2008-0100892 |
| Oct. 14, 2008 | (KR) | ................. 10-2008-0100893 |
| Dec. 5, 2008 | (KR) | ........................ 2008-123595 |

(51) Int. Cl.
  *H01L 21/01* (2006.01)
(52) U.S. Cl. ................ 438/107; 438/381; 257/E21.008
(58) Field of Classification Search ................. 438/128
  See application file for complete search history.

(56) References Cited

U.S. PATENT DOCUMENTS 4,704,785 A    11/1987  Curran (Continued)

*Primary Examiner*—Thao P. Le
(74) *Attorney, Agent, or Firm*—Schmeiser Olsen & Watts LLP

(57) ABSTRACT

A method includes forming a switching device which includes a vertical channel spaced apart from a semiconductor substrate, and forming a storage device which is positioned on opposed sides of the switching device. The storage device includes a cylindrically shaped storage node, a plate electrode coupled to the storage node, and a dielectric film which is formed between the storage node and plate electrode, the storage nodes being electrically connected to the switching device.

5 Claims, 28 Drawing Sheets

U.S. PATENT DOCUMENTS

| | | | |
|---|---|---|---|
| 4,829,018 A | 5/1989 | Wahlstrom | |
| 4,939,568 A | 7/1990 | Kato et al. | |
| 5,087,585 A | 2/1992 | Hayashi | |
| 5,093,704 A | 3/1992 | Saito et al. | |
| 5,106,775 A | 4/1992 | Kaga et al. | |
| 5,152,857 A | 10/1992 | Ito et al. | |
| 5,266,511 A | 11/1993 | Takao | |
| 5,308,782 A | 5/1994 | Mazure et al. | |
| 5,355,022 A | 10/1994 | Sugahara et al. | |
| 5,554,870 A | 9/1996 | Fitch et al. | |
| 5,627,106 A | 5/1997 | Hsu | |
| 5,695,557 A | 12/1997 | Yamagata et al. | |
| 5,737,748 A | 4/1998 | Shigeeda | |
| 5,829,026 A | 10/1998 | Leung et al. | |
| 5,835,396 A | 11/1998 | Zhang | |
| 5,892,225 A | 4/1999 | Okihara | |
| 5,915,167 A | 6/1999 | Leedy | |
| 5,977,579 A | 11/1999 | Noble | |
| 5,980,633 A | 11/1999 | Yamagata et al. | |
| 5,998,808 A | 12/1999 | Matsushita | |
| 6,009,496 A | 12/1999 | Tsai | |
| 6,153,495 A | 11/2000 | Kub et al. | |
| 6,222,251 B1 | 4/2001 | Holloway | |
| 6,229,161 B1 | 5/2001 | Nemati et al. | |
| 6,331,468 B1 | 12/2001 | Aronowitz et al. | |
| 6,531,697 B1 | 3/2003 | Nakamura et al. | |
| 6,534,382 B1 | 3/2003 | Sakaguchi et al. | |
| 6,535,411 B2 | 3/2003 | Jolin et al. | |
| 6,600,173 B2 | 7/2003 | Tiwari | |
| 6,621,168 B2 | 9/2003 | Sundahl et al. | |
| 6,630,713 B2 | 10/2003 | Geusic | |
| 6,677,204 B2 | 1/2004 | Cleeves et al. | |
| 6,742,067 B2 | 5/2004 | Hsien | |
| 6,751,113 B2 | 6/2004 | Bhakta et al. | |
| 6,787,920 B2 | 9/2004 | Amir | |
| 6,822,233 B2 | 11/2004 | Nakamura et al. | |
| 6,854,067 B1 | 2/2005 | Kutz et al. | |
| 6,943,067 B2 | 9/2005 | Greenlaw | |
| 6,943,407 B2 | 9/2005 | Ouyang et al. | |
| 6,995,430 B2 | 2/2006 | Langdo et al. | |
| 7,002,152 B2 | 2/2006 | Grunewald | |
| 7,078,739 B1 | 7/2006 | Nemati et al. | |
| 2002/0024140 A1 | 2/2002 | Nakajima et al. | |
| 2002/0025604 A1 | 2/2002 | Tiwari | |
| 2002/0141233 A1 | 10/2002 | Hosotani et al. | |
| 2003/0067043 A1 | 4/2003 | Zhang | |
| 2004/0156233 A1 | 8/2004 | Bhattacharyya | |
| 2007/0235833 A1* | 10/2007 | Cheng et al. | 257/506 |
| 2008/0048186 A1* | 2/2008 | Cheng et al. | 257/48 |
| 2009/0244954 A1* | 10/2009 | Cannon et al. | 365/149 |

* cited by examiner

SEMICONDUCTOR MEMORY DEVICE

CROSS-REFERENCE TO RELATED APPLICATIONS

This application claims the benefit of Korean Patent Apps. No. 2008-123595 filed on Dec. 5, 2008, the contents of which are incorporated herein by reference.

This application claims the benefit of Korean Patent Apps 10-2008-0100893 filed on Dec. 5, 2008, the contents of which are incorporated herein by reference.

This application claims the benefit of Korean Patent Application 10-2008-0100892 filed on Dec. 5, 2008, the contents of which are incorporated herein by reference.

This application claims the benefit of Korean Patent Application No. 10-2008-50946, filed on May 30, 2008, the contents of which are incorporated herein by reference.

This application is a continuation-in-part of, and claims the benefit of, U.S. patent application Ser. No. 12/470,344, which claims the benefit of Republic of Korea Patent Application No. 10-2008-0046991, the contents of which are incorporated herein by reference.

This application is a continuation-in-part of, and claims the benefit of, U.S. patent application Nos.:

12/040,642, filed on Feb. 29, 2008,
11/092,498, filed on Mar. 29, 2005, now U.S. Pat. No. 7,470,142,
11/092,499, filed on Mar. 29, 2005, now U.S. Pat. No. 7,470,598,
11/092,500, filed on Mar. 29, 2005,
11/092,501, filed on Mar. 29, 2005;
11/092,521, filed on Mar. 29, 2005;
11/180,286, filed on Jul. 12, 2005;
11/378,059, filed on Mar. 17, 2006; and
11/606,523, filed on Nov. 30, 2006;

which in turn are continuation-in-parts of, and claim the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of all of which are incorporated herein by reference in their entirety.

This is also a continuation-in-part of, and claims the benefit of, U.S. patent application Nos.:

11/873,719, filed on Oct. 17, 2007; and
11/873,851, filed on Oct. 17, 2007;

which in turn are divisionals of, and claim the benefit of, U.S. patent application Ser. No. 10/092,521, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

This is also a continuation-in-part of, and claims the benefit of, U.S. patent application Ser. No. 11/873,769, filed on Oct. 17, 2007, which in turn is a divisional of, and claims the benefit of, U.S. patent application Ser. No. 10/092,500, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

BACKGROUND OF THE INVENTION

1. Field of the Invention

This invention relates to bonded semiconductor structures formed using bonding.

2. Description of the Related Art

Along with advances in semiconductor manufacturing technology, a requirement for smaller pattern size and shorter distance between patterns on the chip. Using the smaller pattern size induces problems like higher leakage current. A higher leakage current is one of the barriers to increase pattern density by reducing pattern size.

In order to achieve high density semiconductor memory devices, recent developments focus on stacking semiconductor device on the substrate in three-dimensional structures.

BRIEF SUMMARY OF THE INVENTION

The present invention is directed to bonded semiconductor structures. The novel features of the invention are set forth with particularity in the appended claims. The invention will be best understood from the following description when read in conjunction with the accompanying drawings.

BRIEF DESCRIPTION OF THE DRAWINGS

FIG. 21b is a graph of a doping profile of the semiconductor structure of FIG. 21a.

DETAILED DESCRIPTION OF THE INVENTION

Figure 1:
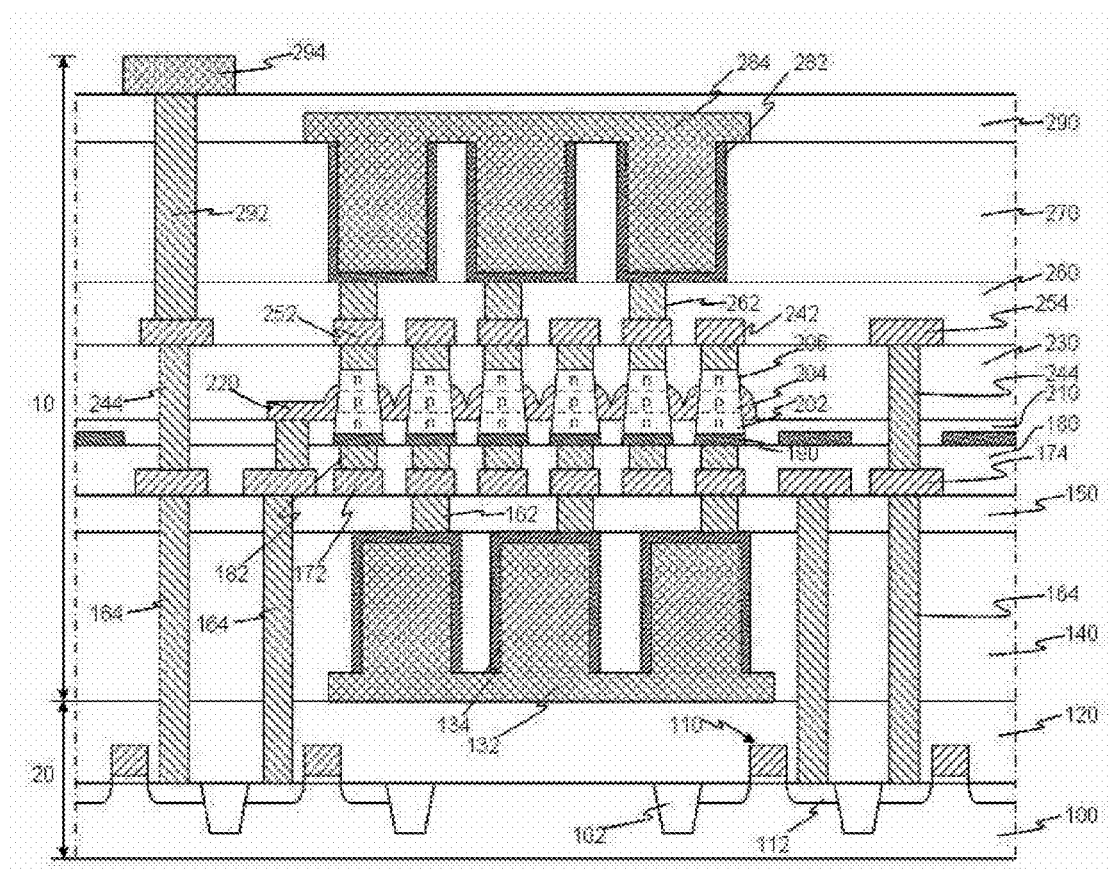
FIGS. 1, 2, 3, 4, 5 and 6 are sectional views of DRAM device.

FIG. 1 is a sectional view of one embodiment of a DRAM device. In this embodiment, the DRAM device includes a logic region 20 and memory cell region 10 which are carried by a semiconductor substrate 100. Specifically, a memory cell region 10 is carried by the logic region 20. The logic region 20 on the semiconductor substrate 100 includes logic devices. The memory cell region 10 is spaced apart from the semiconductor substrate 100, and includes switching devices and storage devices. In other embodiments, the logic region can be positioned on the memory cell region 10.

The semiconductor substrate 100 can include bulk silicon, bulk silicon-germanium, or semiconductor substrate with silicon or silicon-germanium epitaxial layer formed on the substrate. Also, the semiconductor substrate 100 can include silicon-on-sapphire(SOS), silicon-on-insulator(SOI), thin film transistor(TFT), dope or undoped semiconductors, silicon epitaxial layer formed on base semiconductor substrate.

Isolation regions 102 are formed in the semiconductor substrate 100, and these isolation regions 102 define active regions in the semiconductor substrate 100. In the active regions, NMOS and PMOS transistors, resistors (not illustrated), diodes (not illustrated) and wirings 164,174 can be located to form logic devices. The logic devices is used to control switching devices in the memory cell regions 10 to read and write data in the storage devices.

Gate electrode patterns 110 are formed on the active regions of the semiconductor substrate 100. Source/Drain regions 112 are formed at each side of the gate electrode patterns 110 in the active regions. The gate electrode patterns 110 can have stacked structure of gate dielectric film patterns and gate conductor patterns, and a isolation spacer can be formed at each side wall of the gate electrode patterns 110. In the logic region 20, logic devices can be formed as multiple layers on the gate electrode patterns 110 (not illustrated). The logic devices on the logic region 20 can be filled and covered by interlayer dielectric film 120.

Switching devices and storage devices are formed on the logic devices. That is, the switching devices can be formed apart from the semiconductor substrate 100, and the storage devices can be formed on upper and lower side of the switching devices. More specifically, the switching devices can be NMOS or PMOS transistors, and as illustrated in an embodiment of this invention, the transistors can be formed as vertically channeled transistors. Also, in the embodiment of this invention, the storage devices can be capacitors, and the capacitors can be formed on upper and lower side of the switching devices.

More specifically, the capacitors are formed on the interlayer dielectric film 120 which covers the logic devices. In this embodiment, the capacitors can be formed as cylindrical structure or stacked structure. In this embodiment, the example of cylindrical structure will be explained.

First capacitor electrodes 132 can be formed on the interlayer dielectric film 120. The first capacitor electrode 132 can be plate electrode to where ground potential is connected. The first capacitor electrodes 132 are together electrically connected, and each can have pillar shape. On surface of the first capacitor electrodes 132 which is pillar shape, capacitor dielectric film (not illustrated) is deposited conformal. On the dielectric film (not illustrated, second capacitor electrodes 134 are formed to cover the pillar conformal. The second capacitor electrodes 134 surround and cover top surface and sidewalls of the first capacitor electrodes 132. The second capacitor electrodes 134 are electrically separated each other. Specifically, the second capacitor electrodes 134 can be formed to be cylindrical shape which has open lower side.

The first capacitor electrodes 132 and the second capacitor electrodes 134 can be formed with poly-silicon or metallic material, and the dielectric film (not illustrated) can be formed with single layer of tantalum oxide ($Ta_2O_5$) or aluminum oxide ($Al_2O_3$), or stacked films of tantalum oxide/titanium oxide, aluminum oxide/titanium oxide.

The capacitor electrodes 132, 134 are covered with interlayer dielectric films 140, 150. Contact plugs 162 which are connected with the top surface of the second capacitor electrodes 134 and contact plugs 164 which are connected with the logic devices are formed in the interlayer films 140, 150. The second capacitor electrodes 134 are one-to-one connected to the switching devices through the contact plugs 162, 172, 182.

The switching devices are comprised of pillar shaped multiple semiconductor layer patterns 202, 204, 206, and gate electrodes 220 which surround center area of the side walls of the semiconductor layer patterns 202, 204, 206. A gate dielectric film (not illustrated) is formed between sidewall of the semiconductor layer patterns 202, 204, 206 and the gate electrodes 220. In this embodiment, the pillar shaped semiconductor layers patterns 202, 204, 206 are formed by alternatively stacking first conductive semiconductor layer patterns 202, 206 and second conductive semiconductor layer patterns 204. And the first conductive semiconductor layer patterns 202, 206 are located at lower most layer and upper most layer.

In this embodiment of the invention, switching devices are NMOS or PMOS transistors. In case of NMOS transistors, the first conductive semiconductor layer is n-type, and the second conductive semiconductor layer is p-type. In case of PMOS transistors, the first conductive semiconductor layer is p-type, and the second conductive semiconductor layer is n-type.

It should be noted that, in this embodiment, the semiconductor layer patterns 202, 204, 206 can be formed with poly crystalline semiconductor, single crystalline semiconductor, semiconductor including metals, or any combination of these materials. In case of using single crystalline semiconductor, the single crystalline semiconductor layer can be formed by bonding the single crystalline semiconductor. Three-dimensional structured semiconductor by bonding single crystalline semiconductor substrate are well illustrated at Korea Patent Application no. 10-2008-100892 which was filed by same inventor of this patent application.

The first type semiconductor layer patterns 202, 206 which are located at lower-most or upper-most layer are defined as source/drain region, and the second type semiconductor layer patterns 204 which are located in between the first type semiconductor layer patterns 202, 206 are defined as channel region.

The surrounding gate electrodes 220 around the pillar shaped semiconductor layer patterns 202, 204, 206 can be formed in spacer shape on the sidewalls of the pillar shaped semiconductor layer patterns 202, 204, 206, and then can be connected to the gate electrodes which are formed surrounding the neighboring semiconductor layer patterns 202, 204, 206.

Specifically, the pillar shaped semiconductor layer patterns 202, 204, 206 formed on the interlayer dielectric film 180 are located apart to each other in a pre-defined distance to allow the gate electrode 220 which are formed on the sidewalls of the pillar shaped semiconductor layer patterns 202, 204, 206 can be connected each other. With this arrangement, a single gate electrode line 220 which surrounds sidewalls of multiple pillar shaped semiconductor layer patterns. The gate electrode 220 can be electrically connected to the logic devices through contact plugs 164.

The pillar shaped semiconductor layer patterns 202, 204, 206 can be formed by bonding a semiconductor substrate which includes doped layers. In this embodiment, a bonding layer 190 is formed at the bottom surface of the pillar shaped semiconductor layer patterns 202, 240, 206. The bonding layer 190 can be formed with conductive bonding material. In this embodiment, the contact plugs 182 which are electrically connected to the second capacitor electrodes 134 or wirings 172 (i.e. bit lines) can be electrically connected to the bonding layer 190.

Specifically, the bottom surface of the pillar shaped semiconductor layer patterns 202, 204, 206 can be electrically connected to the second capacitor electrodes 134, or can be electrically connected to the bit lines 172. And the bit lines 172 and the second capacitor electrodes 134 are alternatively located at the lower side of the pillar shaped semiconductor layer patterns 202, 204, 206. And the bit lines 172 can be electrically connected to the logic devices through contact plugs 164.

Contact plugs 242 and wirings 252 are continuously formed on the upper side of the pillar shaped semiconductor layer patterns. And second capacitor electrodes 282 are formed on upper side of the pillar shaped semiconductor layer patterns 202, 204, 206 which are electrically connected to the bit lines 172 in the bottom. Specifically, the capacitors 132, 134 and the bit lines 252 are located opposite over the pillar shaped semiconductor layer patterns 202, 204, 206.

Capacitors 282, 284 located on upper side of the switching devices include storage electrodes (i.e. the second capacitor electrodes 282) which have cylindrically shaped with open on top of the cylinder. And surface of each of the second capacitor electrodes 282 are covered with dielectric film (not illustrated). Plate electrodes are then formed on the dielectric film (not illustrated) and fill in the inside of the cylinder shaped second capacitor electrodes 282.

As illustrated in this embodiment, the bottom surface of the pillar shaped semiconductor layer patterns 202, 204, 206 can be electrically connected to the second capacitor electrodes 134, and the top surface can be electrically connected to the bit lines 252. Oppositely, the bottom surface of the pillar shaped semiconductor layer patterns 202, 204, 206 can be electrically connected to the bit lines 252, and the top surface can be electrically connected to the second capacitor electrodes 282.

Wirings 294 can be formed on upper most layer of the memory cell region 10 which are commonly connected to the wirings of memory cell regions 10 and wirings of the logic regions 20. These wirings 294 can be used as conductive pads.

Figure 2:
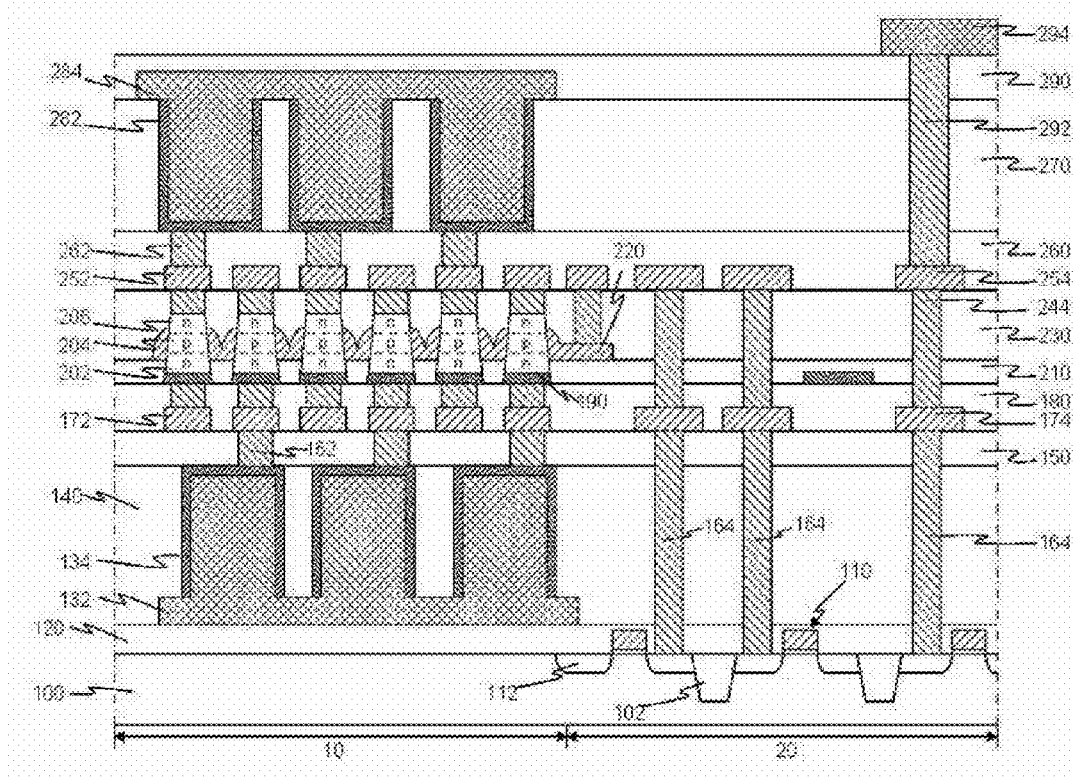

FIG. 2 illustrates a second embodiment of this invention. In this embodiment, commonly used technical details will not be explained but details of difference to the first embodiment will be only explained.

In FIG. 2, in accordance with the second embodiment of this invention, the semiconductor memory device includes memory cell regions 10 and logic regions 20 horizontally. Accordingly, storage devices, logic devices and storage devices are alternatively formed in the memory cell regions 10 or the semiconductor substrate 100. Specifically, the switching devices are formed apart from the surface of the semiconductor substrate 100 on the memory cell regions 10 of the semiconductor substrate 100. The storage devices are formed at upper and lower side of the switching devices. The structure of the switching devices and the storage devices are same as those of the first embodiment of this invention.

Logic devices such as NMOS or PMOS transistors 110, 112 can be formed in the logic regions 20 on the semiconductor substrate 100. And the logic devices, wirings 254, 174 which are connected to the gate electrodes 220 and bit lines 172, 252 of the memory cell regions 10, and contact plugs 164, 244, 292 can be formed. And wirings 294 which are commonly connected to the wirings in the memory cell regions and wirings in the logic regions 20.

In the semiconductor memory device of the first and second embodiments of this invention, the switching devices and the storage devices can have structures illustrated in FIGS. 3, 4, 5 and 6. FIGS. 3, 4, 5 and 6 are sectional views of the memory cell regions in accordance with the first and second embodiments of this invention.

Figure 3:
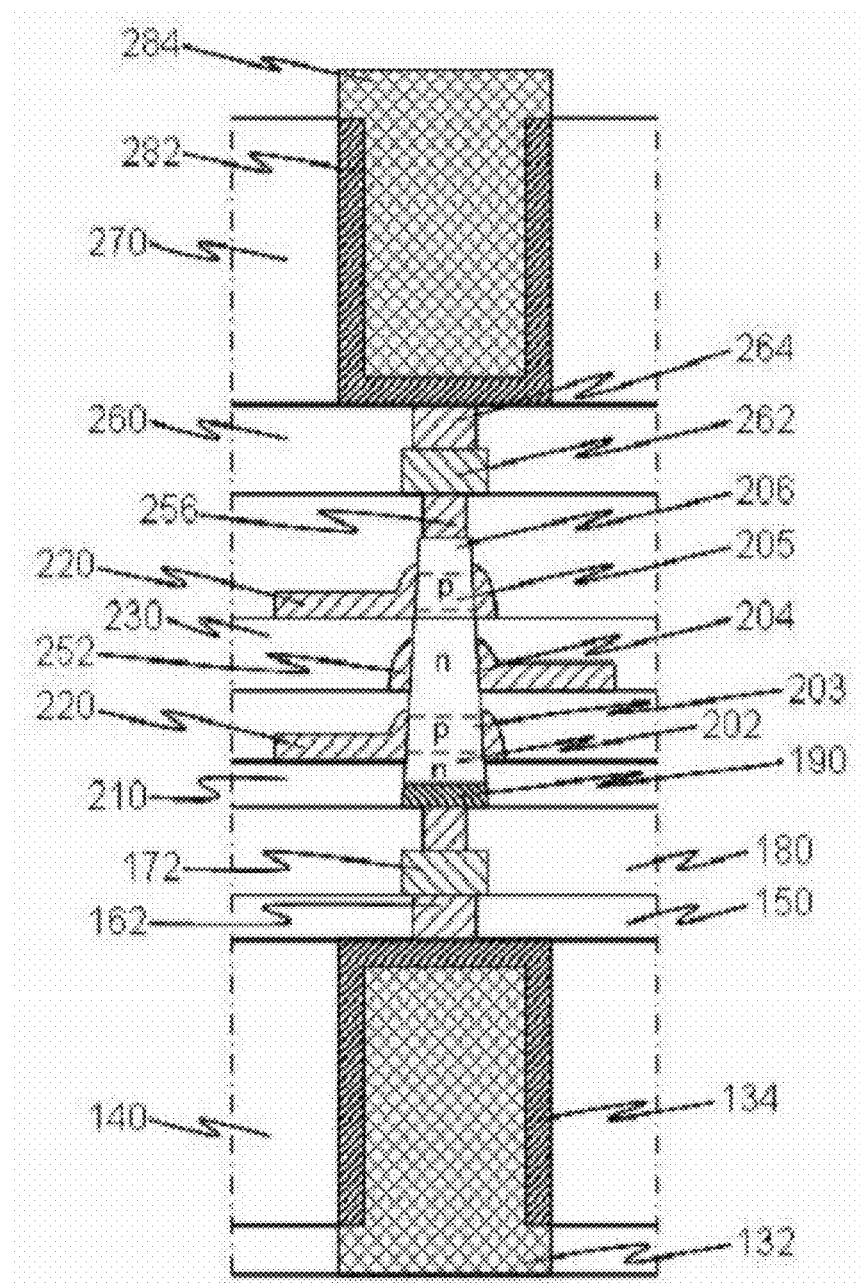

In FIG. 3, the switching devices are transistors with vertical channels, which include the pillar shaped semiconductor layer patterns 202, 203, 204, 205, 206, the gate electrodes 220 and bit lines 252. The storage devices are electrically connected to the top and bottom surface of the pillar shaped semiconductor layer patterns.

More specifically, the pillar shaped semiconductor layer patterns 202, 203, 204, 205, 206 are comprised of alternatively stacked the first type semiconductor layer patterns 202, 204, 206 and the second type semiconductor layer patterns 203, 205, and the first type semiconductor layer patterns 202, 204, 206 are located at upper-most layer and lower-most layer. In this case, at least more than two second semiconductors layer patterns 203, 205 are included. In other words, the pillar shaped semiconductor layer patterns 202, 203, 204, 205, 206 can be formed by stacking n/p/n/p/n or p/n/p/n/p semiconductor layer patterns. The first type semiconductor layer patterns are defined as source/drain regions, and the second type semiconductor layer patterns are defined as channel regions. Gate electrodes 220 are formed surrounding the second type semiconductor layer patterns including gate dielectric film in between. Bit lines 252 are formed around the first type semiconductor layer patterns which are located in the center of the pillar shaped semiconductor layer patterns 202, 203, 204, 206, 206. Specifically, the memory device illustrated in FIG. 3 has a structure such as two memory cells share bit lines 252.

Figure 4:
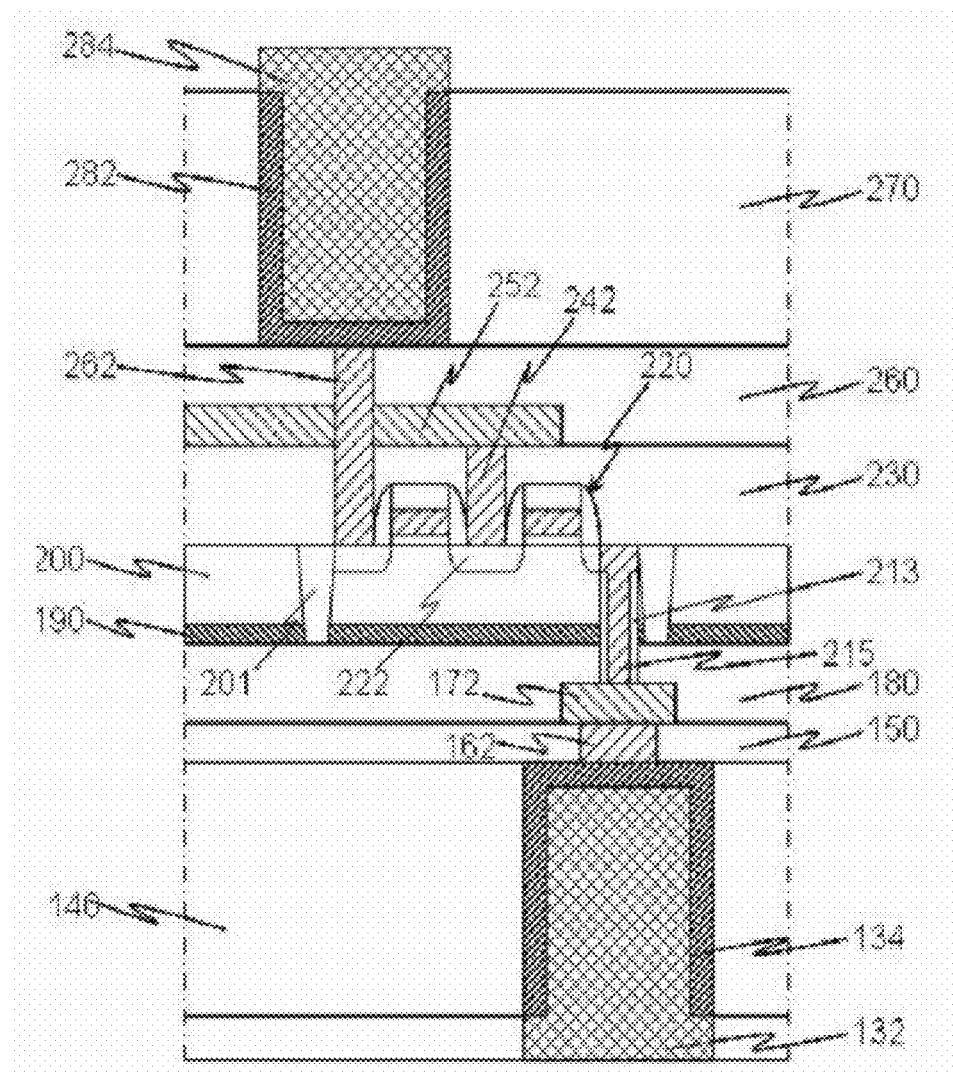

FIG. 4 is a sectional vies of the memory device of this invention. The switching devices are formed on the bonded semiconductor substrate 200 which is apart from the semiconductor substrate 100. The bonded semiconductor substrate 200 includes pre-defined active regions which are defined by isolations 201. The transistors are formed in the active regions. The isolations 201 can be formed by penetrating the bonded semiconductor substrate 200. The transistors include gate patterns 220 formed on the bonded semiconductor substrate 200, and source/drain regions 222 formed each side of the gate patterns 220 in the active regions. The source/drain regions 222 can be formed by ion implanting dopants into the bonded semiconductor substrate 200 to the pre-defined depth or to the bottom of the bonded semiconductor substrate 200.

The neighboring transistors on the bonded semiconductor substrate 200 can share drain regions between the gate patterns 210, and the drain regions 222 are electrically connected to the bit lines 252 through the contact plugs 242. Source regions 222 of the each transistor are electrically connected to the capacitors. The capacitors formed at lower side of the transistors are electrically connected to the bottom of the drain regions 222 through contact plugs 215 which penetrate the bonded semiconductor substrate 200.

An isolation film 213 can be formed around the contact plugs 215 which penetrate the bonded semiconductor substrate 200, in order to electrically isolate the contact plugs 215 from the conductive bonding layer 190 and the bonded semiconductor substrate 200. The isolation film 213 surrounds part of the sidewall of the contact plugs 215. Specifically, the isolation film 213 does not penetrate the bonded semiconductor substrate 200 unlike the contact plugs 215.

In other words, the isolation film 213 does not extend to the drain regions 222 which are formed in the bonded semiconductor substrate 200. This prevents electrical connection between the sidewall of the contact plugs 215 to the bonding layer 190 and the bonded semiconductor substrate 200, and also electrically connect the contact plugs to the drain regions 222.

Figure 5:
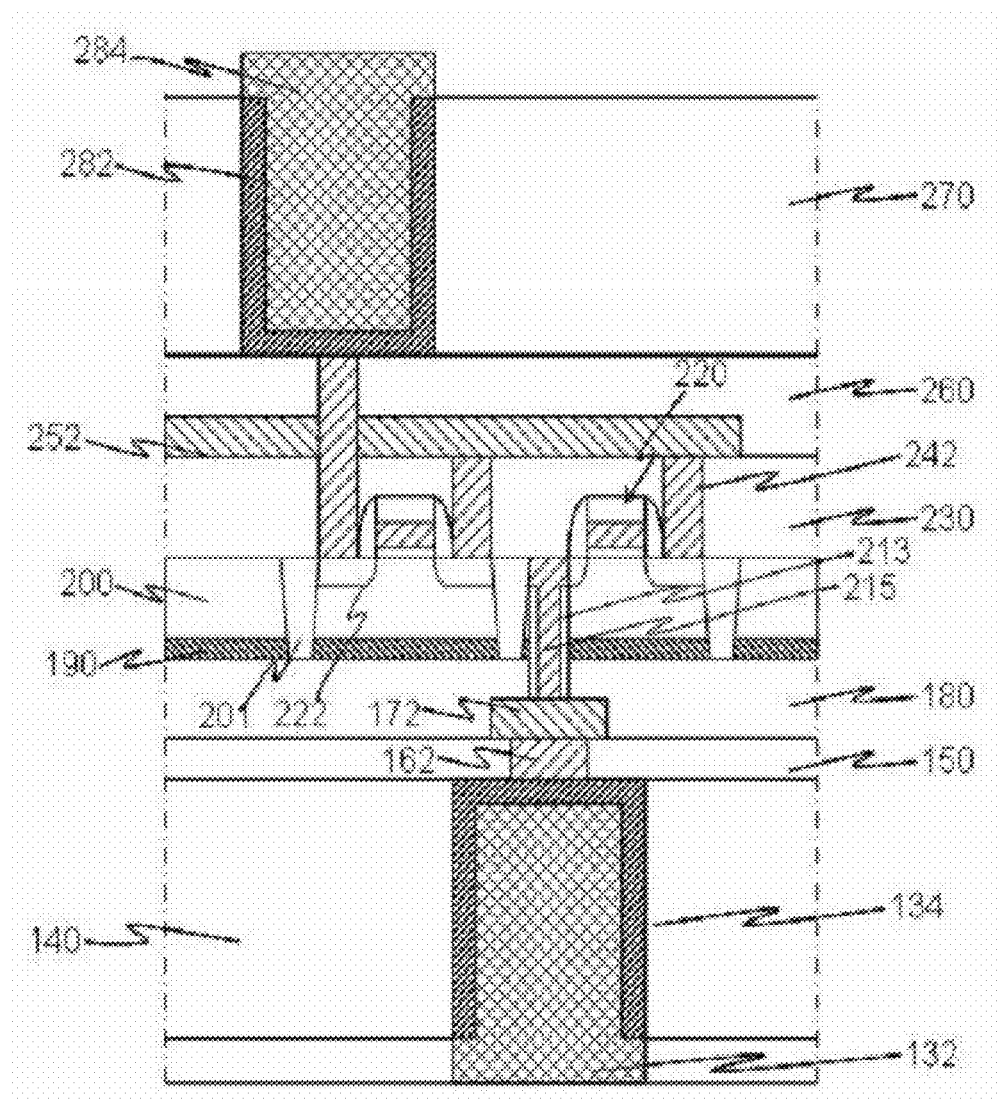

In FIG. 5, the switching devices are formed on the bonded semiconductor substrate 200 which is apart from the semiconductor substrate 100. The bonded semiconductor substrate 200 includes pre-defined active regions which are defined by isolations 201. The transistors are formed in the active regions. The transistors include gate patterns 220 formed on the bonded semiconductor substrate 200 and the source/drain regions formed at each side of the gate patterns 200 in the active regions. The neighboring source/drain regions 222 of the transistors are separated by isolations 201. The bit lines 252 are connected to the drain regions 222 of the transistors. The capacitors are electrically connected to the source regions 222 of each of the transistors. The capacitors formed at lower side of the transistors are electrically connected to the bottom of the drain regions 222 through contact plugs 215 which penetrate the bonded semiconductor substrate 200. The isolation film 213 surrounds part of the sidewall of the contact plugs 215. the isolation film 213 does not extend to the drain regions 222 which are formed in the bonded semiconductor substrate 200.

Figure 6:
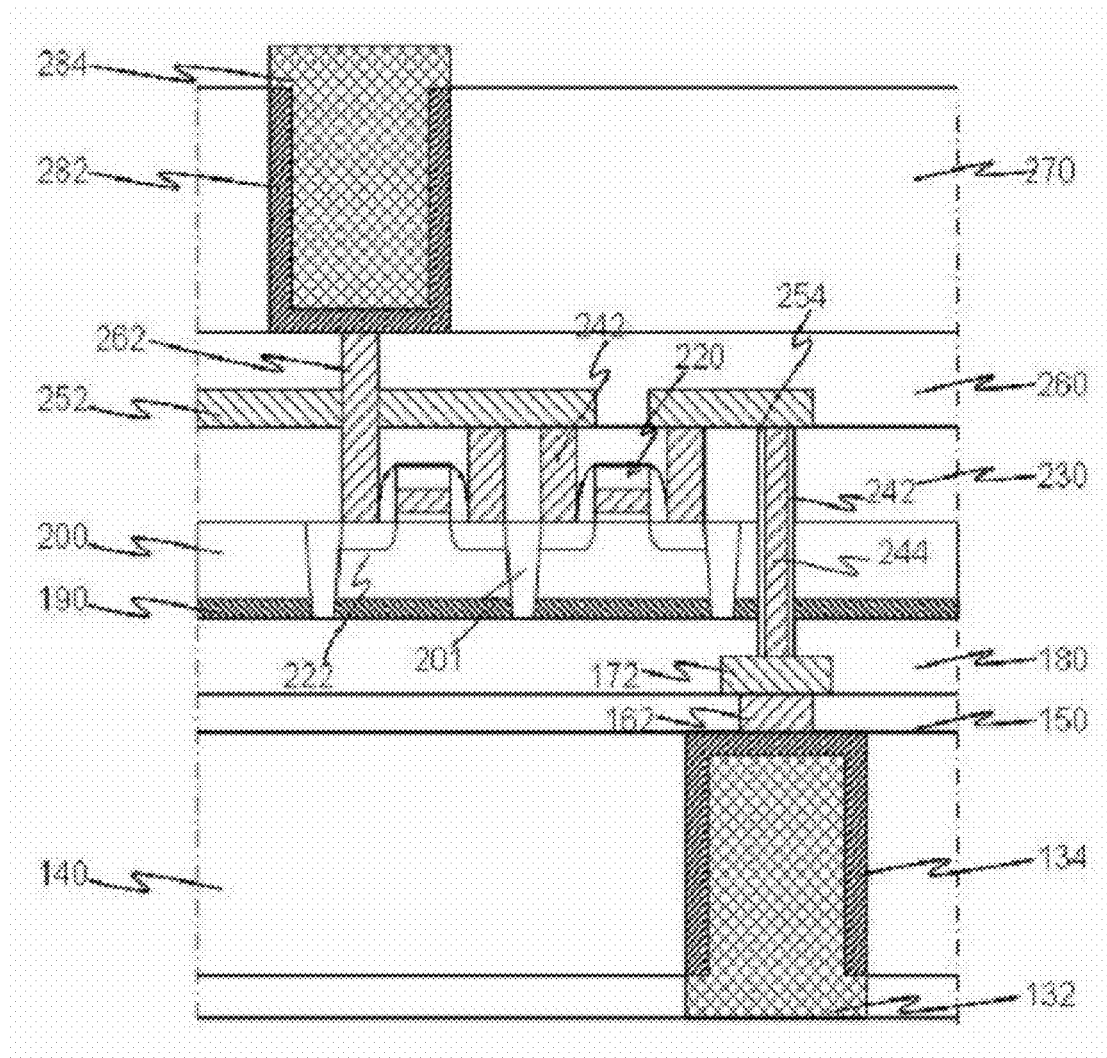

In FIG. 6, transistors are formed on the bonded semiconductor substrate 200, and neighboring source/drain regions 222 are separated by isolations 201. Bit lines 252 are connected to the drain regions 222 of the transistors. Capacitors are electrically connected to the source regions 22 of the transistors. The capacitors formed at lower side of the transistors are electrically connected to the drain regions 222 through the contact plugs 244 penetrating the bonded semiconductor substrate 200 and wirings 254. Isolation film 242 can be formed to surrounds the contact plugs 244 to electrically isolation the contact plugs 244 from the conductive bonding layer 190.

Even though the FIGS. 4, 5 and 6 illustrate forming the capacitors on both upper and lower side of the transistors, the capacitors can be formed only on upper side of the transistors or only on the lower side of the transistors.

Figure 7:
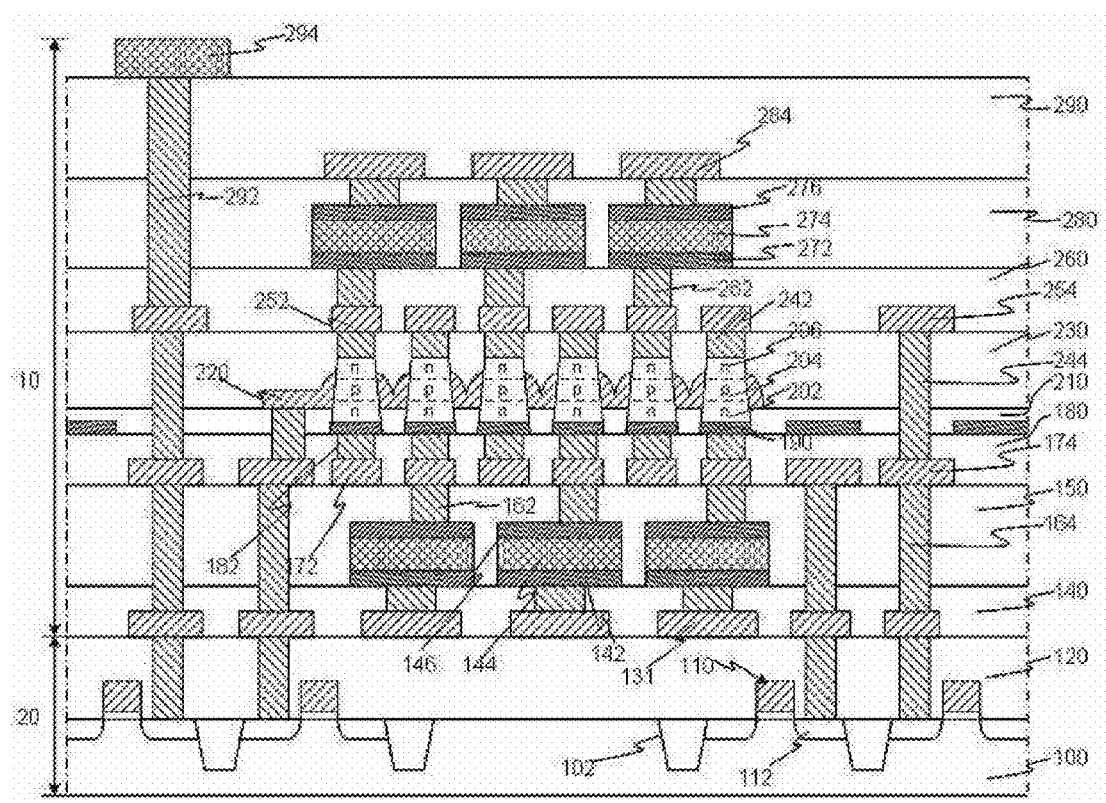
FIGS. 7 and 8 are sectional views of PRAM device.
Figure 8:
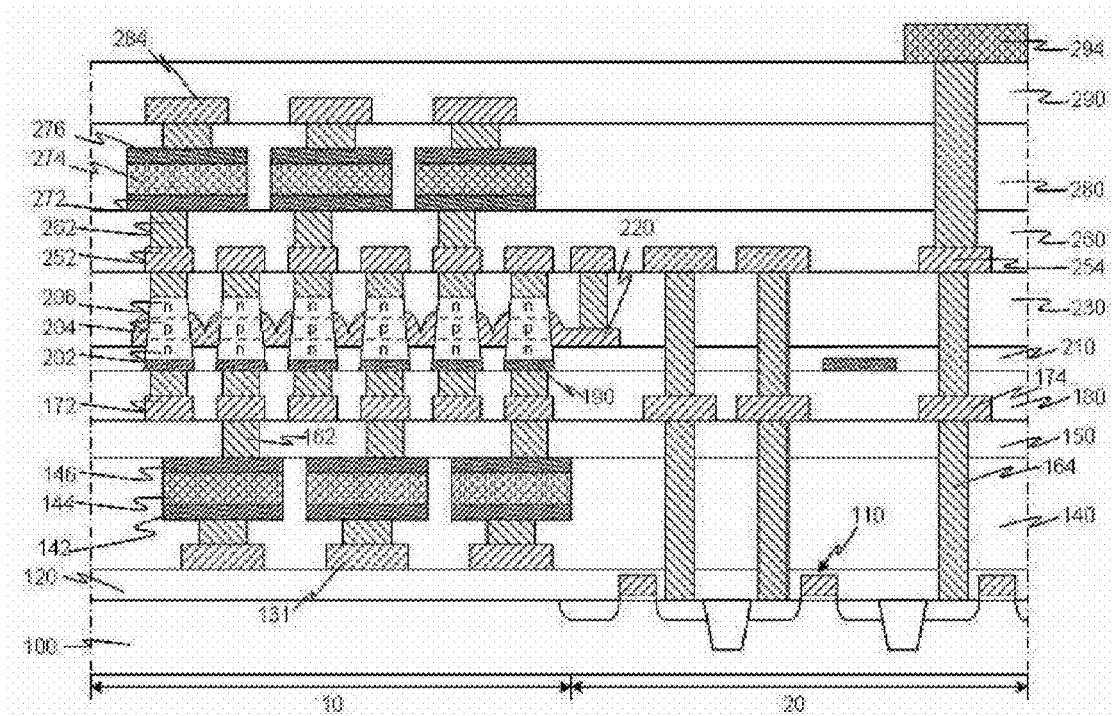

FIGS. 7 and 8 are sectional views of a PRAM device in accordance with other embodiment of this invention.

In FIGS. 7 and 8, a phase change material such as GeSbTe can be used for storage devices in the first and second embodiments of this invention. The phase change material has characteristics that phase can be changed between crystalline and amorphous phase by localized heat generation by adding electrical pulse. This phase change can be used for data storage purpose. Phase change films 144, 274 are formed between first capacitor electrode 142, 276 and second capacitor electrodes 144, 274. By using this phase change characteristics, the semiconductor memory device can store and read digital data of on-off.

Such storage devices are one-to-one connected to the vertical channel switching devices. And the storage devices and the switching devices can be electrically connected to the logic devices which are located at lower side or at one side.

Figure 9:
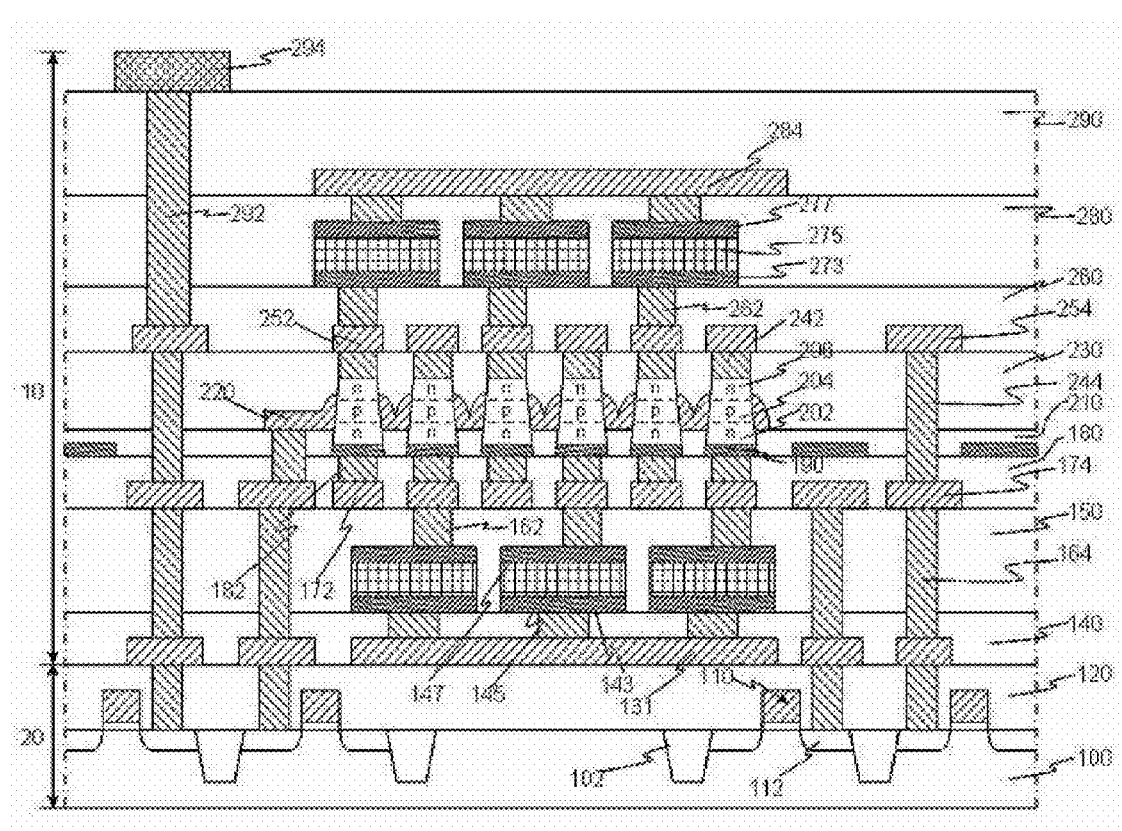
FIGS. 9 and 10 are sectional views of FRAM device.
Figure 10:
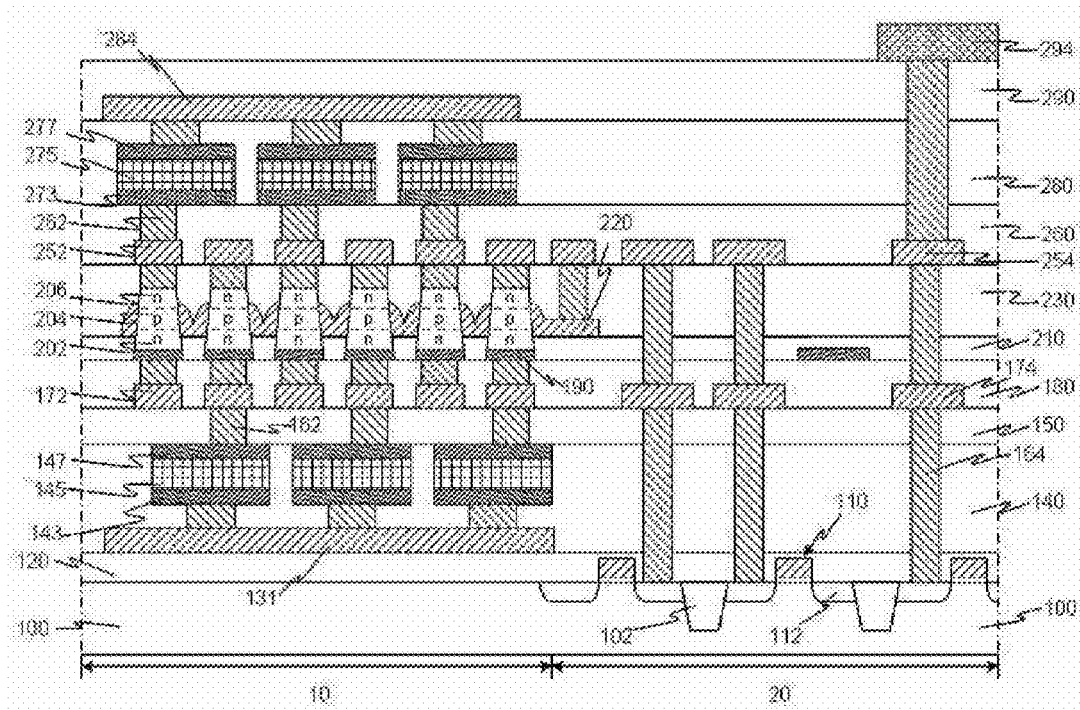

FIGS. 9 and 10 are sectional views of a FRAM device in accordance with other embodiment of this invention.

In FIGS. 9 and 10, a high-k material is used for storage devices in the first and second embodiments of this invention. The high-k material has a very high polarization characteristics so that written data is not removed and sustained even after applied electric field is removed. In these embodiments, high-k film 145, 275 can be formed between the first capacitor electrodes 143, 277 and the second capacitor electrodes 147, 273.

Such storage devices are one-to-one connected to the vertical channel switching devices. And the storage devices and the switching devices can be electrically connected to the logic devices which are located at lower side or at one side.

Figure 11A:
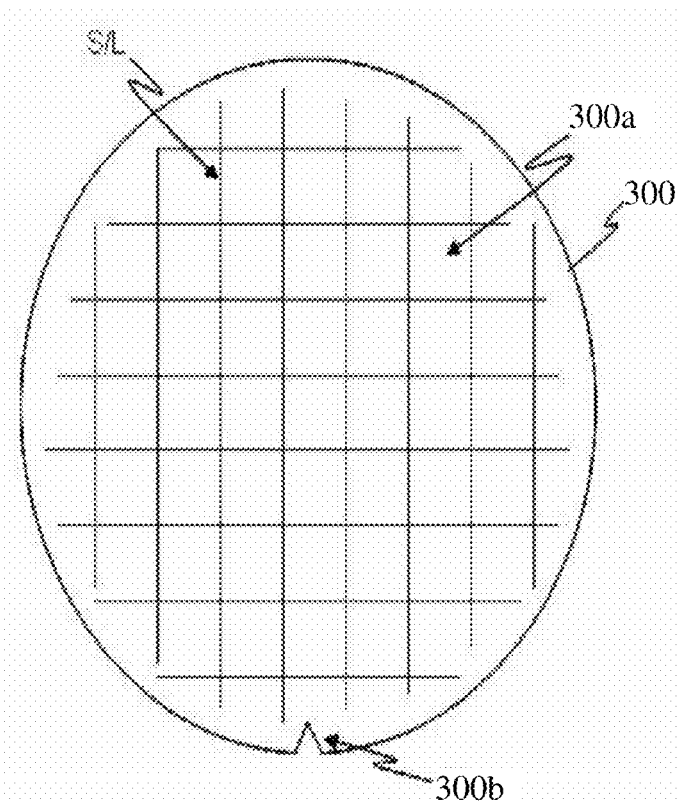
FIG. 11a is a top view of the semiconductor substrate, in accordance with an embodiment of the present invention.
Figure 11B:
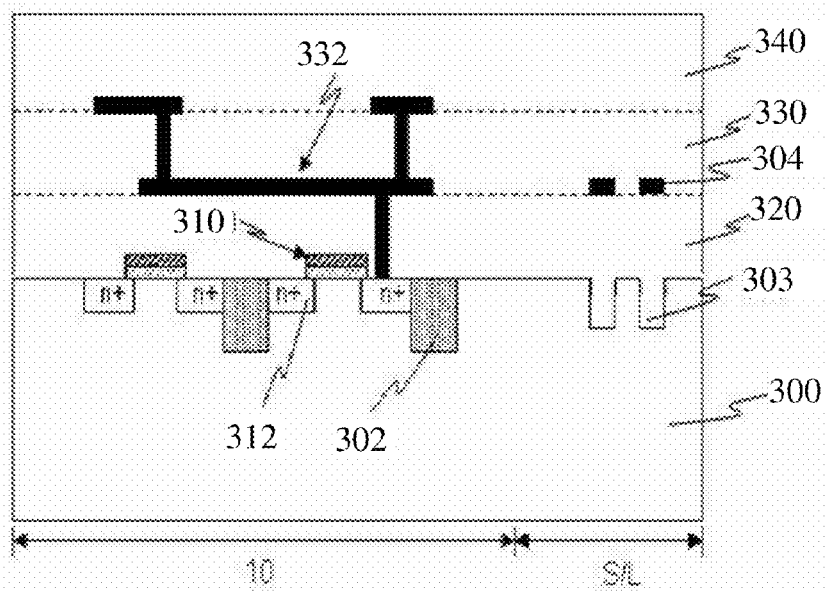
FIG. 11b is a sectional view of a semiconductor device of the semiconductor substrate in FIG. 11a, in accordance with an embodiment of the present invention.

FIGS. 11a and 11b illustrate the first semiconductor substrate 300. The first semiconductor substrate 300 can be bulk silicon, bulk silicon-germanium or epitaxial wafer which has silicon or silicon-germanium epitaxial layer on the semiconductor substrate. The first semiconductor substrate 300 also can be silicon-on-sapphire (SOS), silicon-on-insulator(SOI), thin film transistor(TFT), doped or undoped semiconductors, silicon epitaxial layer formed on base semiconductor substrate, or other semiconductor structures well known to those who are skilled in the art.

The first semiconductor substrate 300 includes multiple semiconductor chip areas 300a and scribe line area(S/L) in between the chip areas 300a in matrix shape. And a notch 300b or flat zone (not illustrated) is form in pre-defined area of the circumference of the semiconductor substrate 300.

After providing the first semiconductor substrate 300, lower semiconductor devices are formed on the chip area 300a in the first semiconductor substrate 300. The lower semiconductor devices can be MOS-FET, DRAM, SRAM, PRAM, Flash Memory or any kind of semiconductor device that is known to those who are skilled in the art. In this embodiment, a method of forming NMOS or PMOS transistors on the first semiconductor substrate 300 will be explained.

Isolations 302 are formed in chip areas 300a on the first semiconductor substrate 300, which will define active areas. The isolations 302 can be formed by forming trench in the first semiconductor substrate 300, and then fill in the trench with isolation materials such as High Density Plasma oxide.

After defining active areas in the first semiconductor substrate 300 by forming the isolations 302, a gate dielectric film and a gate conductor film are deposited and patterned to form gate electrodes 310. After forming the gate electrodes 310, dopants are ion-implanted to the each side of the gate electrodes 310 into the first semiconductor substrate 300 to form source/drain area 312. This completes formation of the transistors on the first semiconductor substrate 300.

While forming the lower semiconductor devices in the chip areas 300a of the first semiconductor substrate 300, scribe lines 303 and alignment keys 304 are formed in scribe lines area(S/L) between chip areas 300a at the same time.

The scribe lines 303 is formed by etching the surface of the first semiconductor substrate to a pre-defined depth. This scribe lines 303 is formed to separate each chips after completion of the formation of the three-dimensional semiconductor devices.

The alignment keys 304 is formed to prevent miss-alignment between upper and lower patterns during the repeated patterning process, and the alignment keys 304 can be formed on the scribe lines 303 in the scribe line area(S/L). The alignment keys 304 can be formed separately in pre-defined area of the circumference of the first semiconductor substrate 300, or can be formed in both scribe line areas(S/L) and the circumference of the semiconductor substrate 300.

As forming the alignment keys 304 on the first semiconductor substrate 300, multiple layers of interconnects are formed on the first semiconductor substrate 300. Each of the layers can include alignment keys 304 respectively when forming interconnects in the multiple layers.

Specifically, a first interlayer dielectric film 320 is formed after forming the transistors on the first semiconductor substrate 300. The first interlayer dielectric film 320 can be formed by depositing a dielectric film which has good uniformity.

For example, the first interlayer dielectric film 320 can be formed with films such as phosphosilicate Glass(PSG), borophosphosilicate Glass(BPSG), undoped silicate glass(USG) or plasma enhanced-tetraethylorthosilicate glass(PE-TEOS).

Then, contacts and wirings 332 are formed in the first interlayer dielectric film 320, which are electrically connected to the transistors in the lower area. The contacts 332 can be formed by selectively isotropic etching the first interlayer dielectric film 320, forming contact holes by exposing source/drain area 312 or gate conductor 310, depositing conducting material into the contact holes. The contacts and wirings 332 can be electrically connected to the gate electrode 310 or source/drain area 312.

After forming the first interlayer dielectric film 320, scribe lines 303 and alignment keys 304 in the lower region can be exposed by removing films on the scribe line area(S/L). Or, in other embodiment, scribe lines and alignment keys can be re-formed in the first interlayer dielectric film 320 in the scribe line area(S/L).

Second and third interlayer dielectric films 330, 340 can be formed after forming the contacts and wirings 332 in the first interlayer dielectric film 320, and each of the interlayer dielectric films 330, 340 can include contacts and wirings 332 respectively.

Various conducting materials can be used to form the contact and wirings 332. Those conducting materials can be aluminum or copper which are commonly used for semiconductor integrated circuits, or refractory materials can be used to reduce thermal affect from the following semiconductor fabrication processes. The contacts and wirings 332 can be formed with tungsten(W), titanium(Ti), molybdenum (Mo), tantalum (Ta), titanium nitride (TiN), tantalum nitride (TaN), zirconium nitride (ZrN), or an alloy formed by combination of the tungsten nitride (TiN) and those other materials.

Figure 12A:
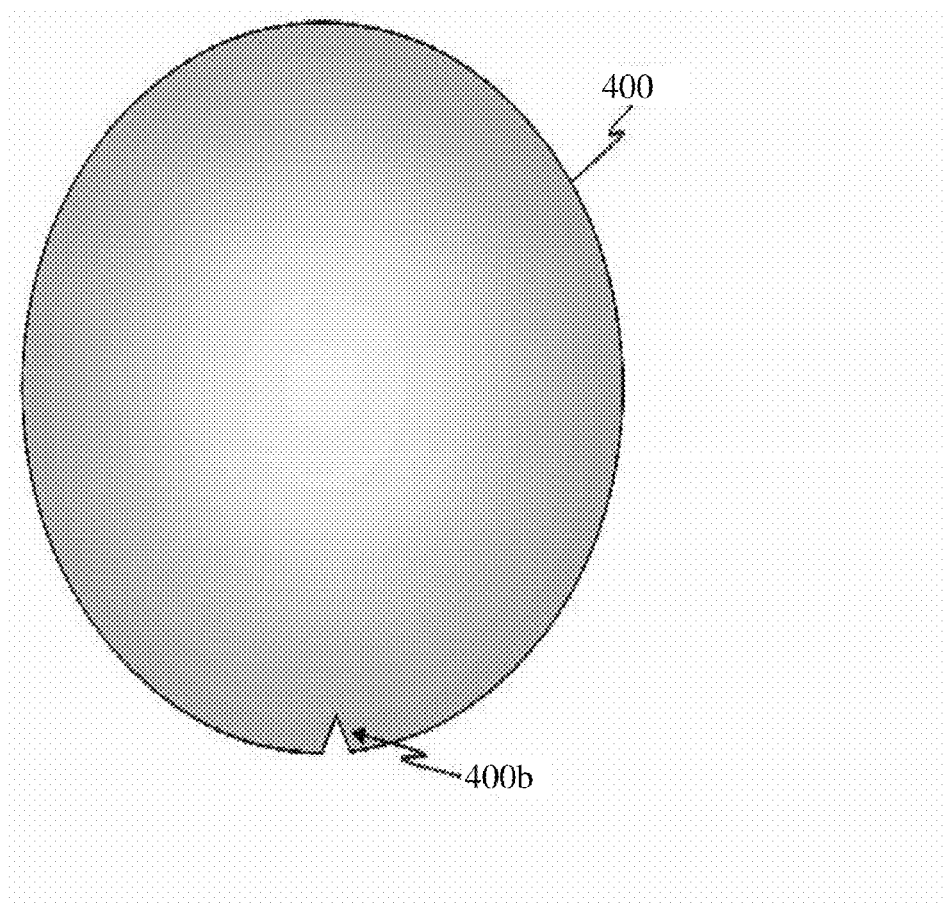
FIG. 12a is a top view of the semiconductor substrate, in accordance with an embodiment of the present invention.
Figure 12B:
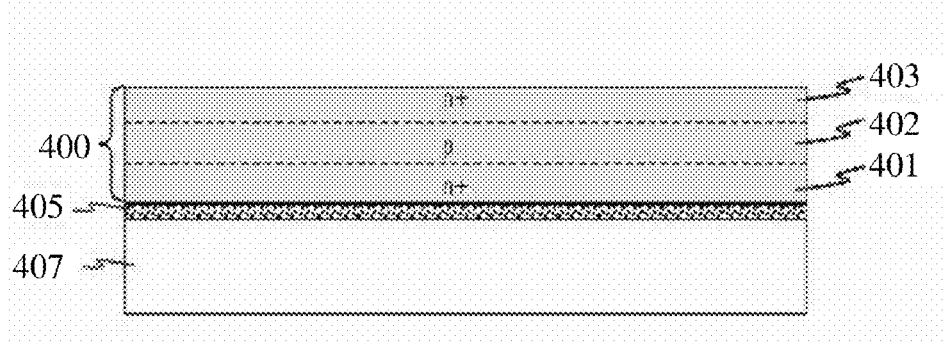
FIG. 12b is a sectional view of a semiconductor device of the semiconductor substrate in FIG. 12a, in accordance with another embodiment of the present invention.

FIGS. 12*a* and 12*b* illustrate formation of the second semiconductor substrate 400.

A single crystalline semiconductor substrate 407 is provided as the second semiconductor substrate including multiple doped layers. The multiple doped layers can be formed by ion-implanting dopants into the single crystalline semiconductor substrate 407, or growing epitaxial layers while adding dopants during the epitaxial layers to form the single crystalline semiconductor substrate 407.

At this time, n-type doped layers 401, 403 and p-type doped layers 402 can be formed to be alternatively located during the ion-implantation process. Specifically, n/p/n or p/n/p structured doped layers can be formed from the surface of the second semiconductor substrate. The multiply doped layers 400 which is formed in the second semiconductor substrate can provide channel regions and source/drain regions when forming transistors in following steps.

A detaching layer 405 is formed in a pre-defined depth of the single crystalline semiconductor substrate 407, and the detaching layer 405 is contacted with the doped layers 400. The detaching layer 405 can be comprised of porous layer, insulating films such as oxide or nitride, organic bonding layer or strained layer such as SiGe crystalline dislocations. In one embodiment of the previous art, exfoliating implant method in which ion-implanting Hydrogen into the wafer surface is known. But this exfoliating implant method can destroy lattice structure of the doped layer 400 by heavy ion-implanting. In this case, to recover the destroyed lattice structure, a long time thermal treatment in very high temperature is required. This long time/high temperature thermal treatment can severely deform the cell devices of the lower region.

The role of the detaching layer 405 is to protect doped layers 400 when removing the single crystalline semiconductor substrate region 407 after bonding the second semiconductor substrate 400. Also, the detaching layer helps to precisely detaching the single crystalline semiconductor substrate 407 while only remaining doped layer 400.

Figure 13:
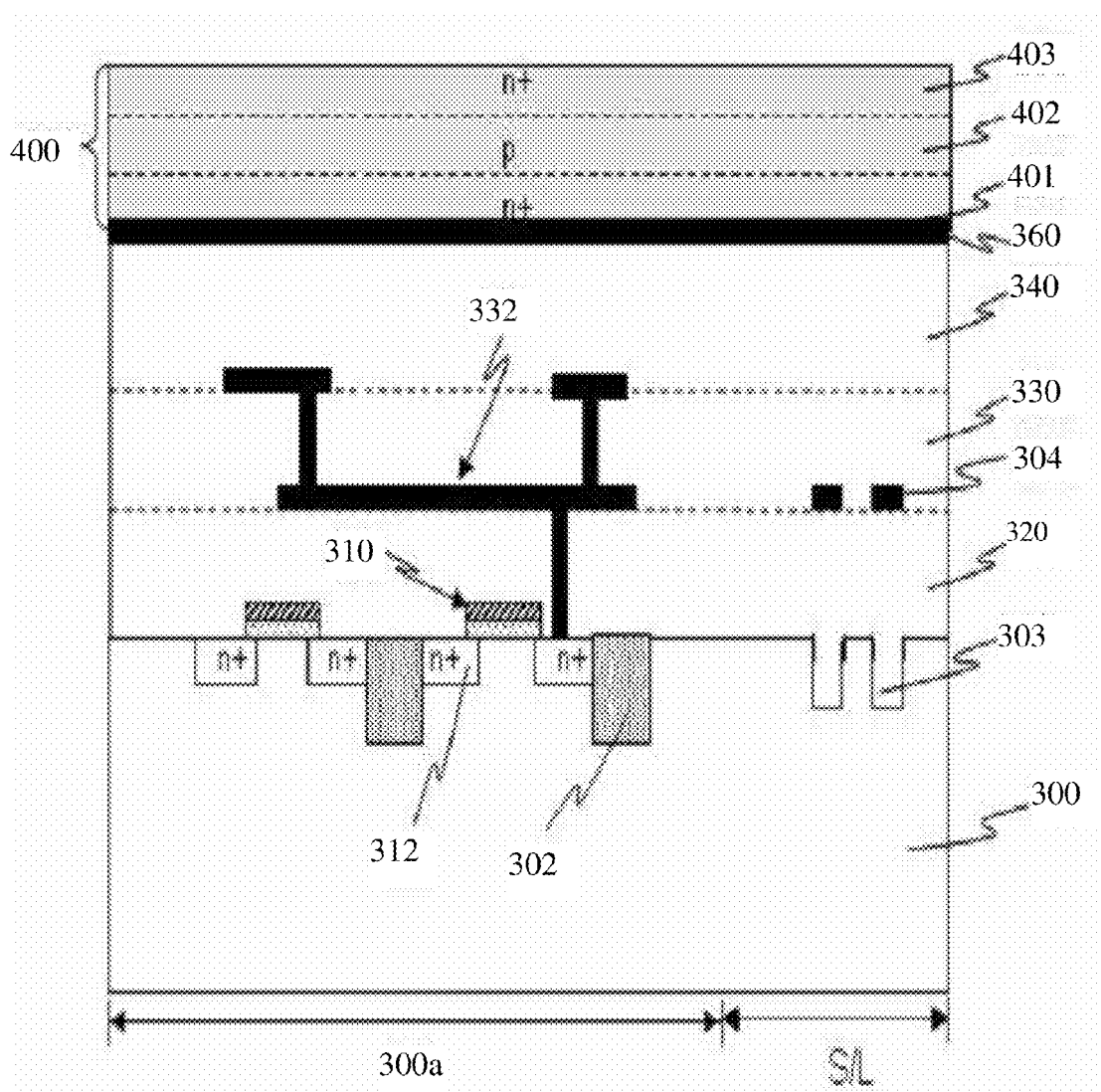
FIG. 13 is a sectional view of a semiconductor device which illustrates bonded substrates, in accordance with the other embodiment of the present invention.
Figure 14A:
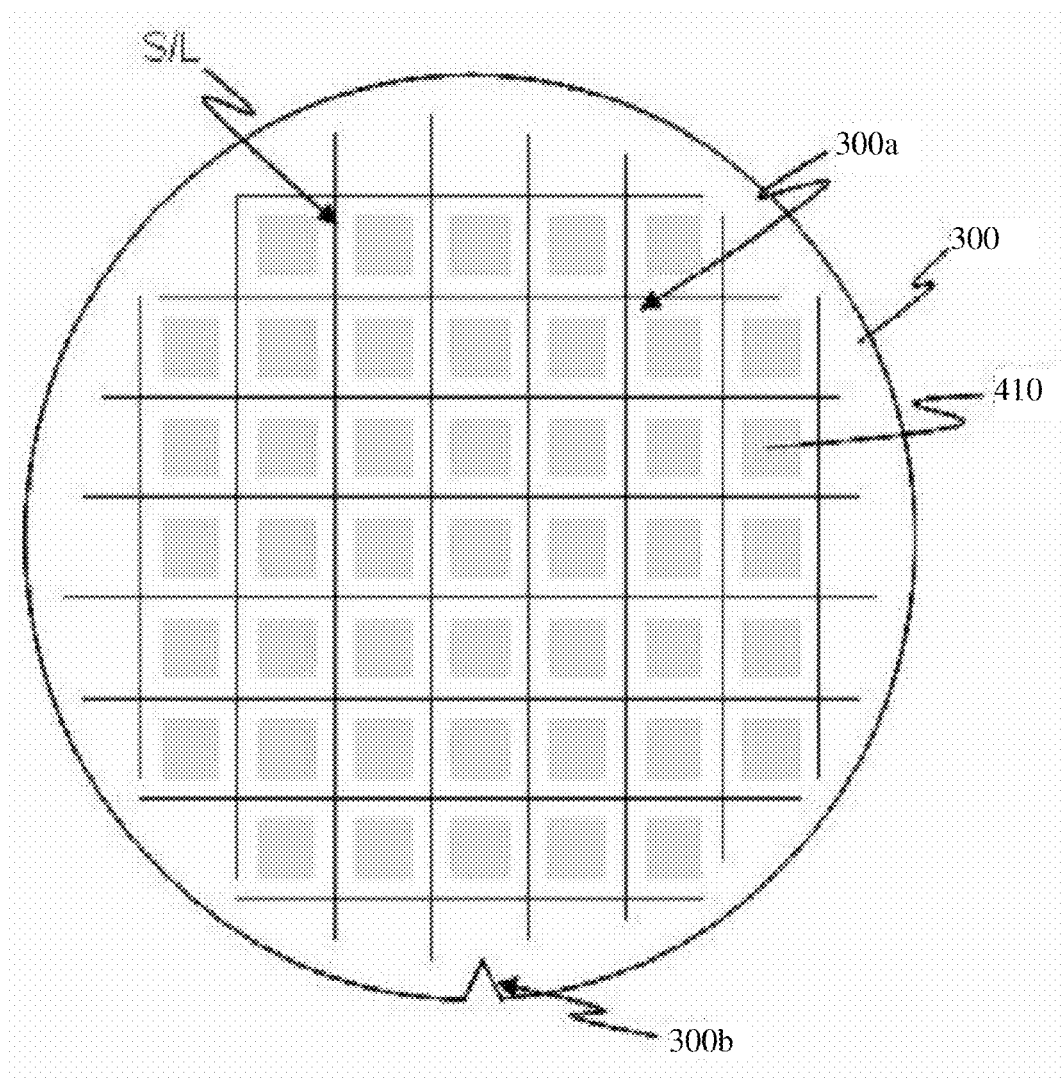
FIGS. 14a, 14b, 15, 16 and 17 are sectional views of steps in forming a semiconductor device, in accordance with the present invention.
Figure 14B:
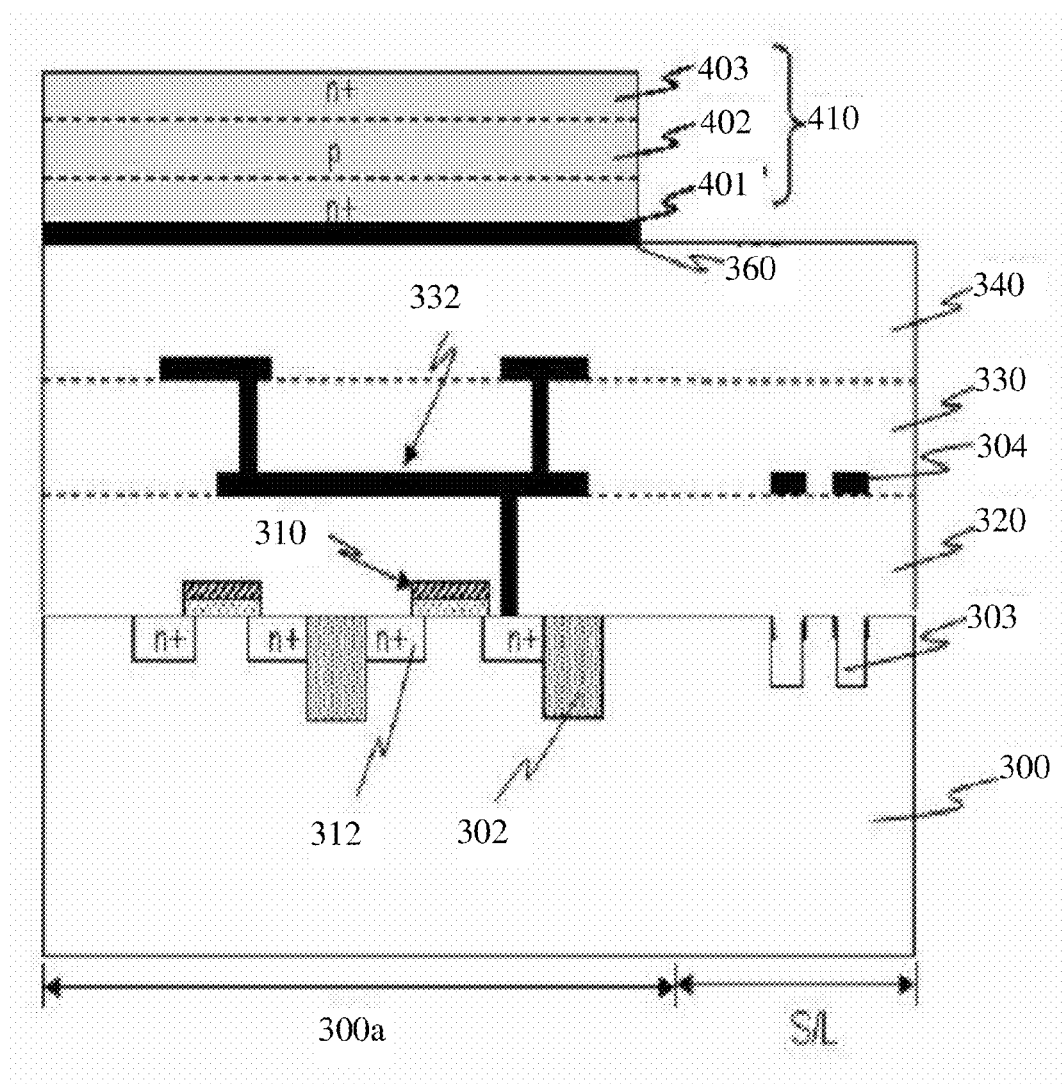

FIG. 13 illustrates the method of bonding the single crystalline semiconductor substrate 407 to the first semiconductor substrate 300 to be the doped layer 400 is facing to the third interlayer dielectric film 340 which is upper most layer of the first semiconductor substrate 300. Before bonding each surfaces of the third interlayer dielectric film 340 and doped layer 400, a bonding layer 360 can be formed on the third interlayer dielectric film 340.

The bonding layer 360 can be formed with, for example, photo-setting adhesive such as reaction-setting adhesive, thermal-setting adhesive, photo-setting adhesive such as UV-setting adhesive, or anaerobe adhesive. Further, the bonding layer can be, such as, metallic bond (Ti, TiN, Al), epoxy, acrylate, or silicon adhesives.

In case of using metals as the bonding layer 360, the metals can be comprised of the material which has lower melting temperature than that of the materials used for wirings 350 in the lower region. Also, the bonding layer 360 can be formed with materials which can be re-flowed during the planarization process in low temperature. This re-flow process can reduce formation of void during the bonding process and improve the bonding strength because it can reduce micro roughness of the surface of the bonding layer 360.

In one embodiment of this invention, the bonding process was explained with bonding the metallic film bonding layer 360 and the semiconductor substrate 400, it can also be performed by bonding dielectric film to dielectric film, dielectric film to semiconductor film, or metal to metal.

After bonding the third interlayer dielectric film 350 and doped layer 400, the bonded substrates can be compressed and thermal treated to increase bonding strength.

It should be noted that there are no semiconductor devices formed yet on the single crystalline semiconductor substrate 407 when bonding the single crystalline semiconductor substrate 407 on the multiply doped layer 400 on the third interlayer dielectric film 340. Because there are no semiconductor devices yet formed on the single crystalline semiconductor substrate 407, when bonding the single crystalline semiconductor substrate 407 on the first semiconductor substrate, no precise alignment between to substrate is required but only the flat zone or notch 300*b* (FIG. 11*a*) of the first semiconductor substrate and the flat zone or notch 400*b* (FIG. 12*a*) can be aligned to be bonded.

After completely bonding the doped layer 400 of the single crystalline semiconductor substrate 407, regions excluding the doped layer 400 are completely removed.

Specifically, surface of the bonded single crystalline semiconductor substrate 407 is grinded, polished or/and etched until the detaching layer 405 is exposed. After the detaching layer 405 is exposed, anisotropic or isotropic etching process is followed to expose the surface of the multiply doped layers. In this embodiment, n-type doped layer 403 is exposed.

The exposing of the multiply doped layers can be performed by selectively etching the films using different etch rate between different type of films or different density of the similar materials. Or, the detaching layer 405 can be comprised of materials with weak crystalline lattice so that the detaching layer 405 can be cracked when a physical shocks is applied to detach the single crystalline semiconductor substrate 407 and the multiply doped layer 400.

In other embodiment of this invention, the single crystalline semiconductor substrate 407 can be provided with glass wafer as a medium. In this embodiment, the multiply doped layer 400 can be formed on the glass wafer, and then transferred to another semiconductor substrate, as two step processes.

As explained, by bonding the single crystalline semiconductor substrate 407 which includes multiply doped layer 400 on the third interlayer dielectric film 340 and then removing the single crystalline semiconductor substrate 407 excluding the multiply doped layer 400, the multiply doped layer 400 can be formed on the third interlayer dielectric film 340.

As illustrated in FIGS. 4a and 4b, the multiply doped layer 400 is patterned to form patterned multiply doped layer 400 only on the chip areas 300a. Specifically, etching mask (not illustrated) is formed on the multiply doped layer 400 in order to open the scribe lines(S/L). And then the multiply doped layers 400 in the scribe lines(S/L) is removed using the etching mask (not illustrated).

This removing process removes multiply doped layers 400 on the areas of the scribe lines 303 and the alignment keys 304 of the first semiconductor substrate 300.

As a result of the removing process, multiply doped layer patterns 410 is formed in the chip areas 300a on the third interlayer dielectric film 340.

Figure 15:
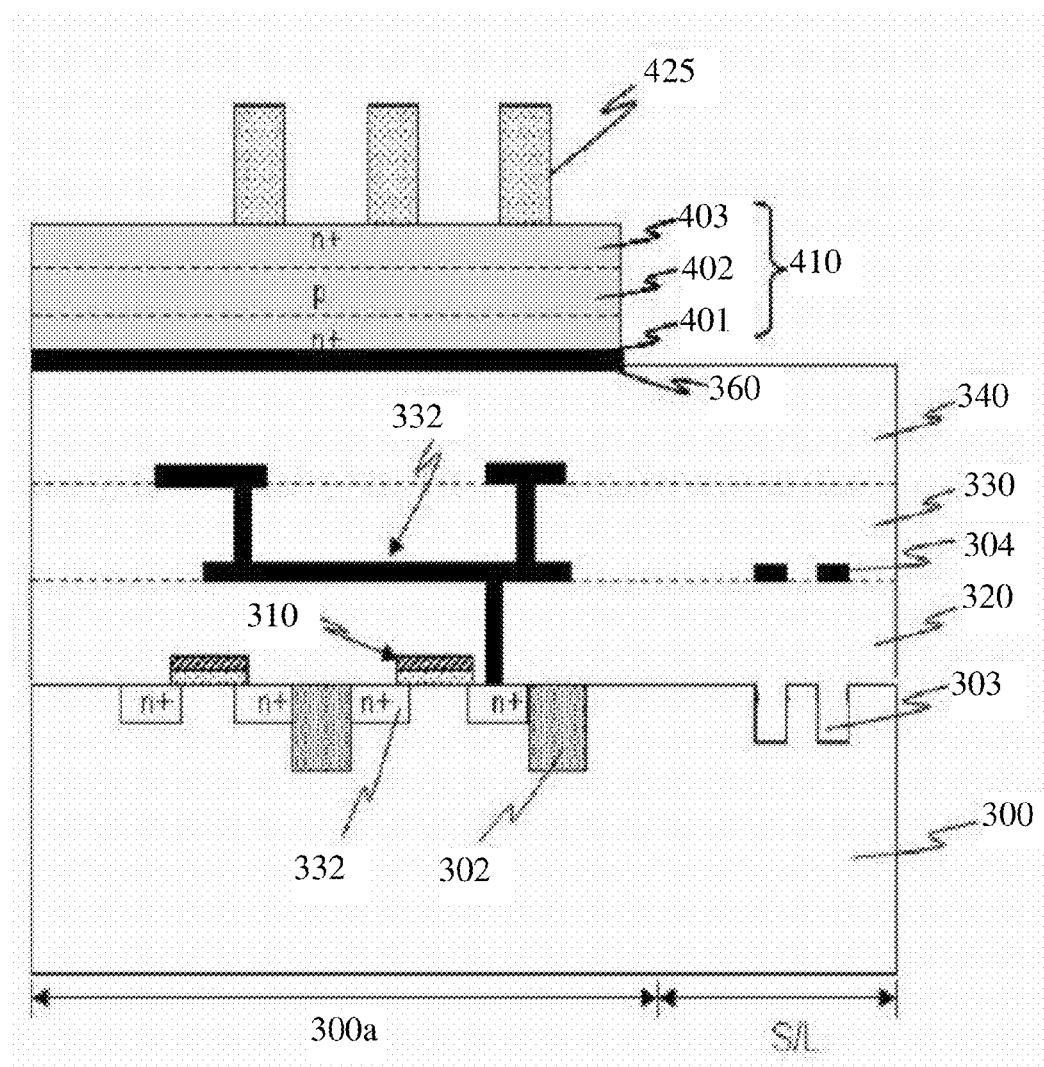

FIG. 15 illustrates formation of the upper semiconductor devices using the remaining multiply doped layers 410 in the chip region 300a. In this embodiment, forming a vertically oriented transistors in the upper region which have vertically arranged channels will be only explained. It should be noted that While particular embodiments of the invention have been shown and described, numerous variations and alternate embodiments will occur to those skilled in the art. In this case, the transistor in the upper region also can be formed to be same structure with the transistors in the lower region.

Specifically, photoresist patterns 425 are formed on the multiply doped layer patterns 410 on the chip areas 300a to form upper semiconductor devices.

Figure 16:
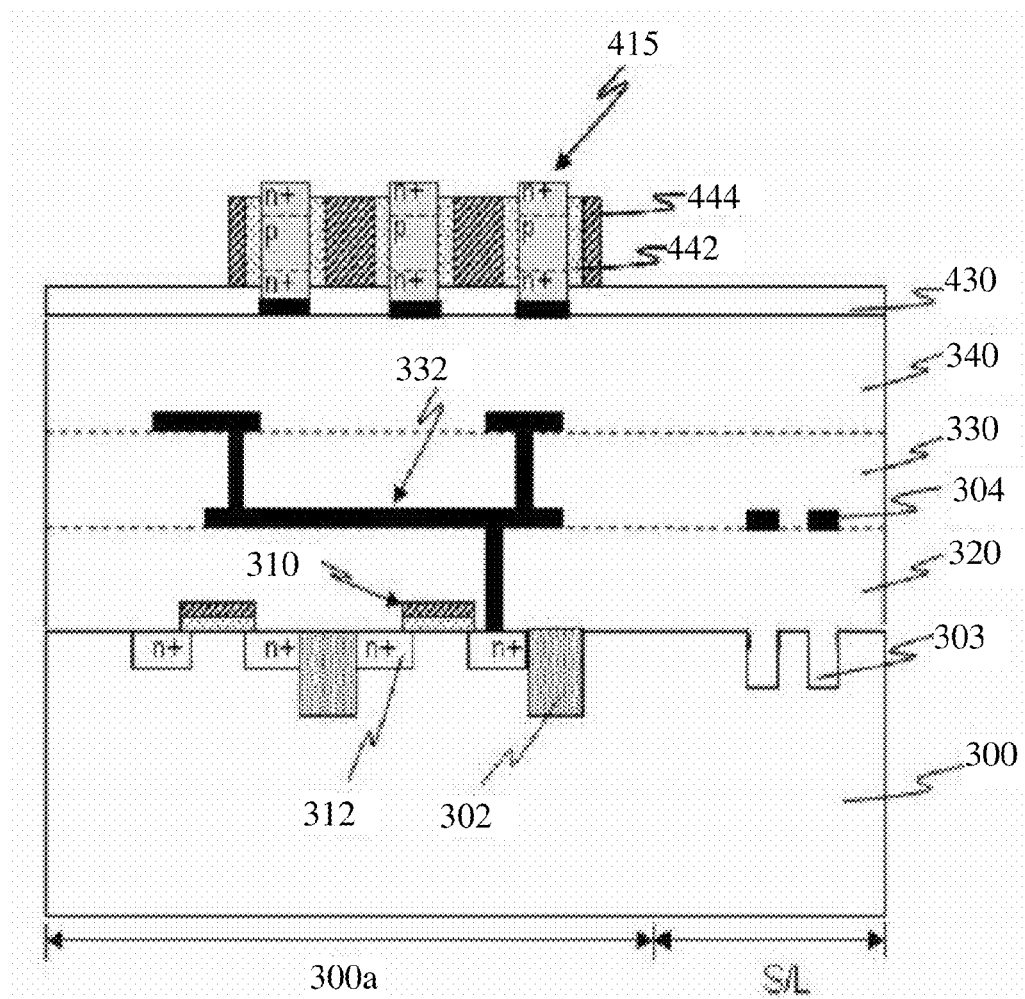
Figure 17:
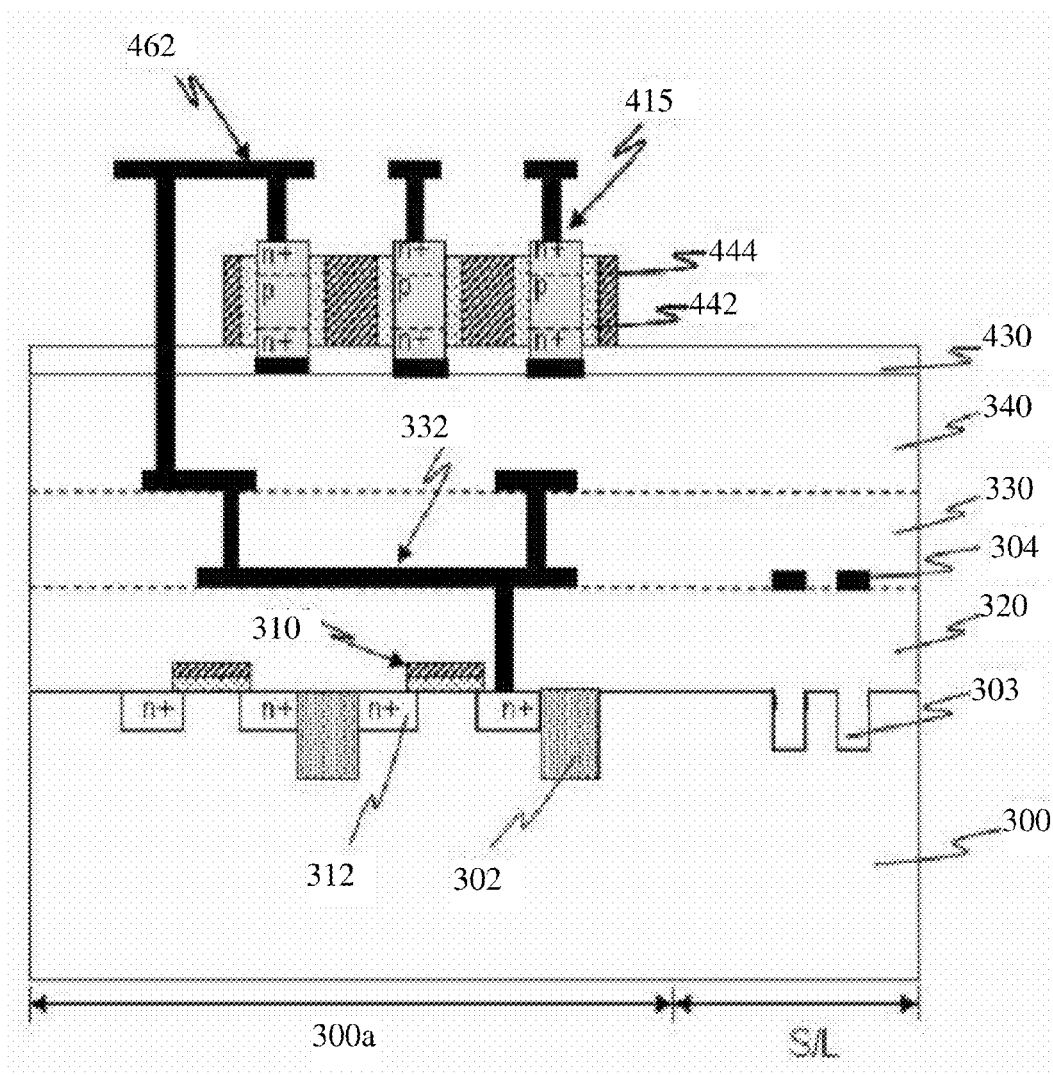

Using the photoresist pattern 425, as illustrated in FIG. 16, the multiply doped layer patterns 410 is etched to form pillar shaped multiply doped layer patterns 415 on the chip areas 300a of the third interlayer dielectric film 340. The multiply doped layer patterns 410 is sequentially etched until the surface of the third interlayer dielectric film 340 is exposed. This completes formation of the channel regions and source/drain regions of the transistors.

As following steps, a gate dielectric film 442 and a gate conductor film 444 is formed at each side of the pillar shaped multiply doped layer patterns 415 to form a gate electrode. Specifically, a fourth interlayer dielectric film 430 is formed on the third interlayer dielectric film 340 on where the pillar shaped multiply doped layer patterns 415, and then the gate dielectric film and the gate conductor film is uniformly deposited. Then, the gate dielectric film and the gate conductor film are anisotropically etched to form the gate electrodes which surround the channeled region as spacer shape.

After forming the gate electrode, a fifth interlayer dielectric film 450 is formed to completely cover the upper semiconductor devices. Contacts and wirings 462 can be formed in the fifth interlayer dielectric film 450 as a following step. The part of the contact and wirings 462 can be electrically connected to the lower semiconductor devices on the first semiconductor substrate.

Figure 18:
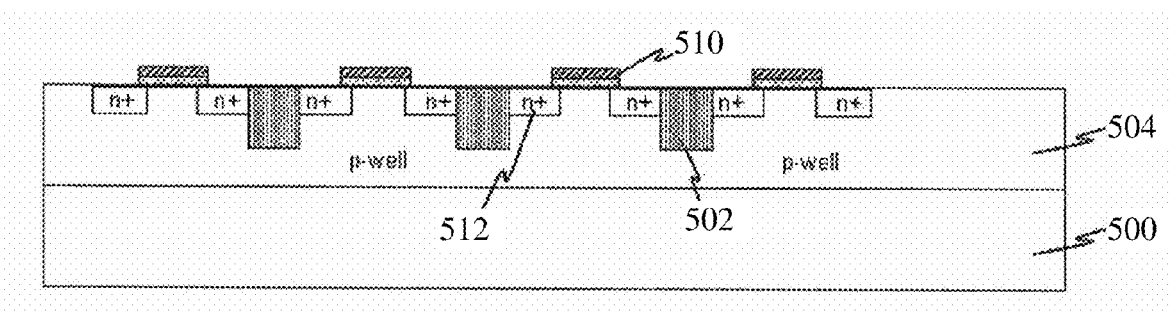
FIGS. 18, 19 and 20 are sectional views of steps in forming a bonded semiconductor device.

FIG. 18 illustrates the first semiconductor substrate 500 which has lower region semiconductor device on it. The type of the lower region semiconductor device is not limited, but in general, MOS-FET, DRAM, SRAM, PRAM or Flash memory device can be formed. In this embodiment of this invention, it will be described as forming NMOS or PMOS transistors on the first semiconductor substrate 500.

Specifically, the first semiconductor substrate 500 can be bulk silicon, bulk silicon-germanium or epitaxial wafer which has silicon or silicon-germanium epitaxial layer on the semiconductor substrate. The first semiconductor substrate 500 also can be silicon-on-sapphire (SOS), silicon-on-insulator (SOI), thin film transistor (TFT), doped or un-doped semiconductors, silicon epitaxial layer formed on base semiconductor substrate, or other semiconductor structures well known to those who are skilled in the art.

As following steps, a well region 504 is formed in the first semiconductor substrate 500. The well region 504 can be formed by ion-implanting dopants into the surface of the first semiconductor substrate 500. The well region 504 on which NMOS devices will be formed can be ion-implanted by ion such as boron to form p-type well region, and the well region 504 on which PMOS devices will be formed can be ion-implanted by ion such as phosphorous to form n-type well region. In this embodiment of this invention, it will be described only NMOS device will be formed on the first semiconductor substrate 500.

After forming the well region 504, isolations 502 are formed. The isolations 502 can be formed by forming trenches on the first semiconductor substrate 500, and then fill-in the trenches with dielectric materials such as High Density Plasma(HDP) oxide.

After defining active region by forming the isolations 502, gate electrodes 510 are formed on the first semiconductor substrate 500 by depositing gate dielectric film and gate conductor film, patterning the gate dielectric film and the gate conductor film. After forming the gate electrodes 510, each side of the gate electrode 510 is ion-implanted with dopants into the first semiconductor substrate 500 to form source/drain region 512. This completes forming the transistors on the first semiconductor substrate 500.

Figure 19:
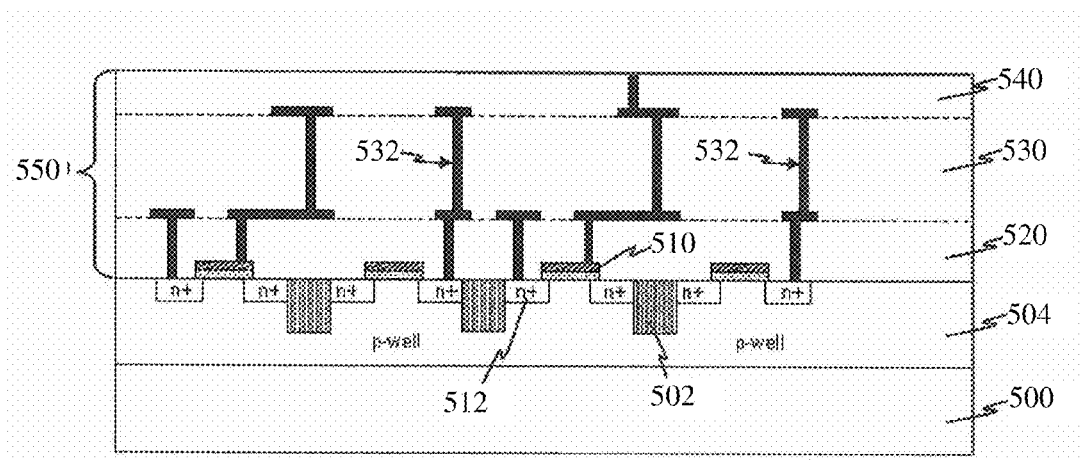

FIG. 19 illustrates a method of forming multiple layers of interconnects 550.

Specifically, a first interlayer dielectric film 520 is formed by depositing dielectric film with good uniformity after forming the transistors on the first semiconductor substrate 500. For example, the first interlayer dielectric film 520 can be formed with films such as phosphosilicate Glass (PSG), borophosphosilicate glass (BPSG), undoped silicate glass (USG) or plasma enhanced-tetraethylorthoSilicate glass (PE-TEOS).

Then, contacts and wirings 532 are formed in the first interlayer dielectric film 520, which are electrically connected to the transistors in the lower area. The contacts 532 can be formed by selectively anisotropic etching the first interlayer dielectric film 520, forming contact holes by exposing source/drain area 512 or gate conductor 510, depositing conducting material into the contact holes. The contacts and wirings 532 can be electrically connected to the gate electrode 510 or source/drain area 512.

After forming the contacts and wirings 532 in the first interlayer dielectric film 520, a second and third interlayer dielectric film 530, 540 can be formed with the contacts and wirings 532 respectively.

Various conducting materials can be used to form the contact and wirings 532. Those conducting materials can be aluminum or copper which are commonly used for semiconductor integrated circuits, or refractory materials can be used to reduce thermal affect from the following semiconductor fabrication processes. The contacts and wirings 532 can be formed with tungsten (W), titanium (Ti), molybdenum (Mo), tantalum (Ta), titanium nitride (TiN), tantalum nitride (TaN), zirconium nitride (ZrN), or an alloy formed by combination of the tungsten nitride(TiN) and those other materials.

Figure 20:
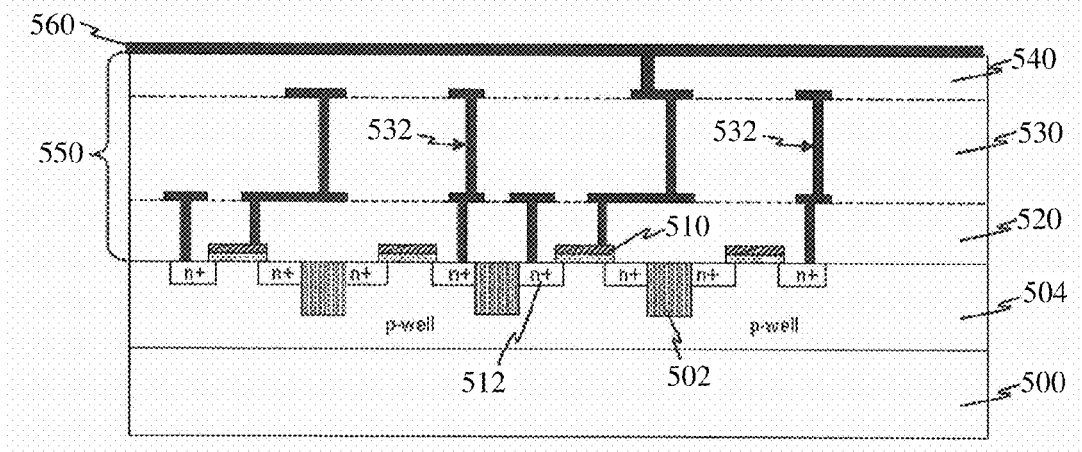

FIG. 20 illustrates formation of bonding layer 560. The bonding layer 560 is formed on the third interlayer dielectric film 540 which is the upper most layer of the first semiconductor substrate 500 and bonds a second semiconductor substrate 600 (FIG. 22) on where upper region semiconductor devices are formed.

The bonding layer 560 can be formed with, for example, photo-setting adhesive such as reaction-setting adhesive, thermal-setting adhesive, photo-setting adhesive such as UV-setting adhesive, or anaerobe adhesive. Further, the bonding layer can be, such as, metallic bond (Ti, TiN, Al), epoxy, acrylate, or silicon adhesives.

In case of using metals as the bonding layer 560, the metals can be comprised of the material which has lower melting temperature than that of the materials used for wirings 550 in the lower region. Also, the bonding layer 560 can be formed with materials which can be re-flowed during the planarization process in low temperature. This re-flow process can reduce formation of void during the bonding process and improve the bonding strength because it can reduce micro roughness of the surface of the bonding layer 560.

In one embodiment of this invention, the bonding process was explained with bonding the metallic film bonding layer 560 and the semiconductor substrate 600, it can also be performed by bonding dielectric film to dielectric film, dielectric film to semiconductor film, or metal to metal.

Figure 21A:
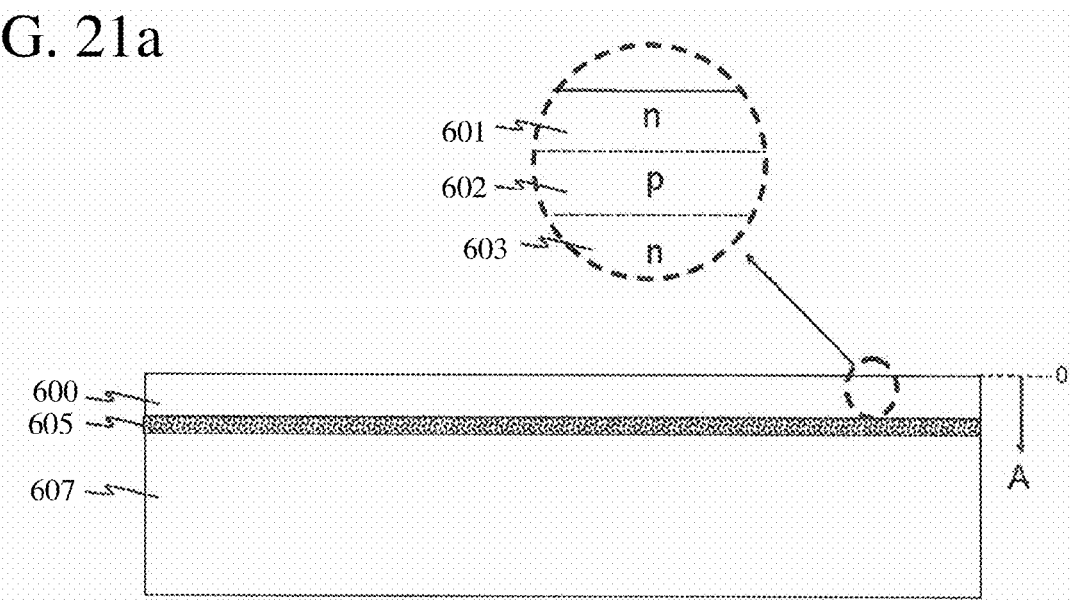
FIG. 21a is a side view of a semiconductor structure.
Figure 21B:
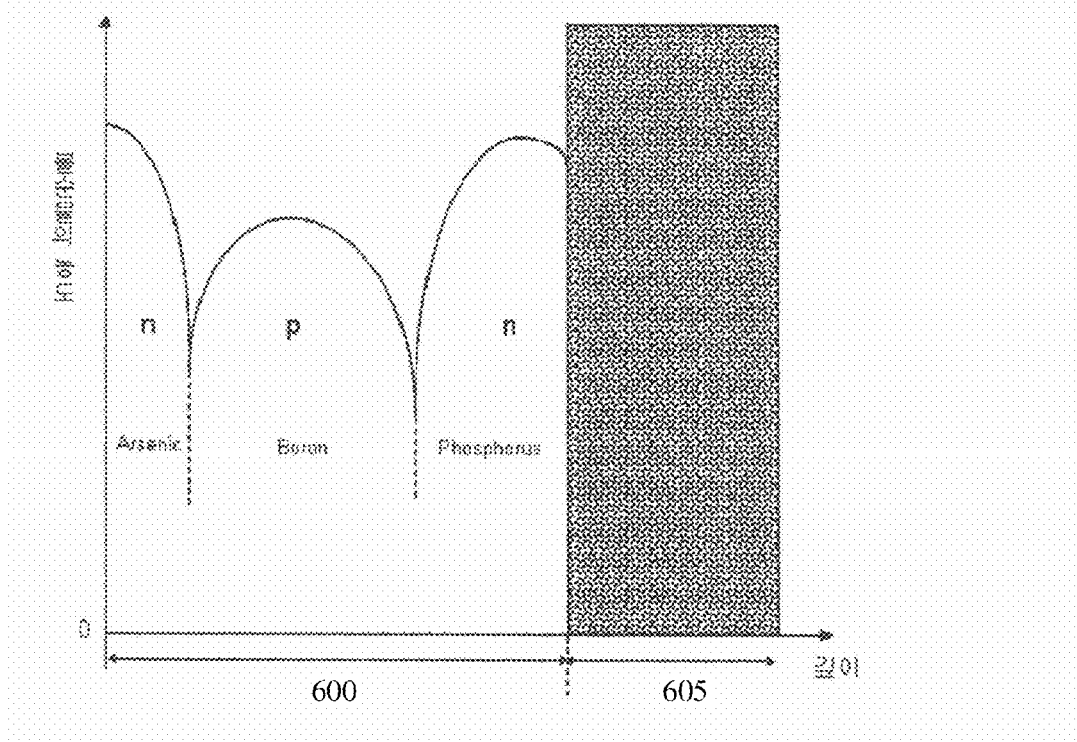

FIGS. 21a and 21b illustrate formation of a second semiconductor substrate 600.

A single crystalline semiconductor substrate 607 is provided as an second semiconductor substrate. The single crystalline semiconductor substrate 607 includes multiple doped layers 600 in pre-defined depth. The multiple doped layers 600 can be formed by ion-implanting dopants into the single crystalline semiconductor substrate 607 or by adding dopants during epitaxial growth process for growing the single crystalline semiconductor substrate 607.

It should be noted that the multiple doped layers 600 can be formed to have n-type doped layers 601, 603 and p-type doped layer 602 alternatively. Specifically, the second semiconductor substrate can be formed to have n/p/n or p/n/p type doped layers from the surface of the second semiconductor substrate. The multiple doped layers 600 can provide channel region and source/drain region when forming transistors at the following fabrication steps.

As illustrated in FIG. 21b, when forming multiple doped layers 600 in the second semiconductor substrate, the dopant which have bigger ion size is formed in near surface of the semiconductor substrate. Specifically, n-type dopant ion which has bigger ion size is formed in shallow depth from the surface of the semiconductor substrate when forming n/p/n structured multiple doped layers. This forms the first doped layer 601. As a following step, p-type dopant is ion-implanted below the first doped layer 601 to form the second doped layer 602. Lastly, n-type dopant which has smaller ion size than that of the ions of the first doped layer 601 is ion-implanted below the second doped layer 602 to be located deepest area from the surface of the semiconductor substrate among three doped layers.

For example, Arsenic ion is known to have relatively bigger ion size among n-type dopants. The Arsenic is formed in a shallow depth from the surface of the semiconductor substrate. Then boron, a p-type dopant, is formed below the Arsenic doped layer. Next, phosphorus ion which is n-type and has smaller ion size than that of Arsenic is formed below the p-type doped layer.

Figure 22:
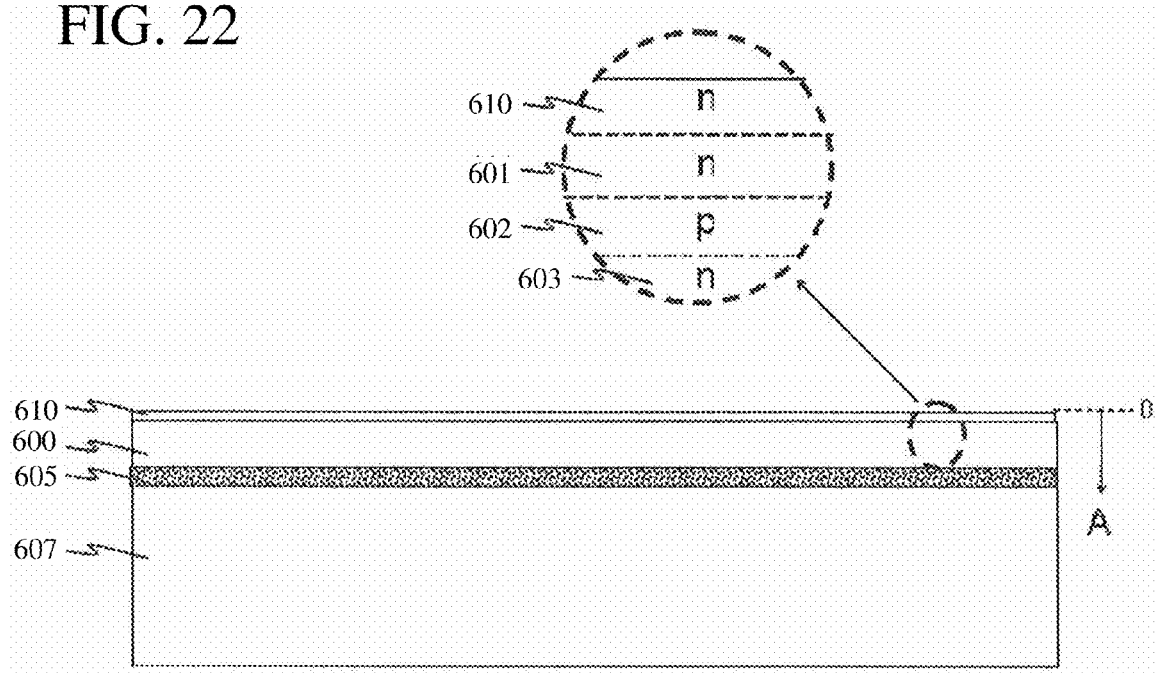
FIGS. 22, 23, 24 and 25 are sectional views of steps in forming a bonded semiconductor structure.

FIG. 22 illustrates formation of a fourth doped layer 610. The fourth doped layer 610 is formed to increase thickness of the first doped layer 601.

Specifically, in this embodiment of this invention, a poly crystalline semiconductor layer is formed on the first doped layer 601. Then, n-type dopants such as Arsenic or Phosphorus is ion-implanted to the poly crystalline semiconductor layer to form the fourth doped layer 610. Or, the fourth doped layer 610 can be formed by forming the poly crystalline semiconductor layer on the first doped layer 601 while doping n-type dopant during the forming the poly crystalline semiconductor layer as in-situ process.

In another embodiment of this invention, an epitaxial layer can be formed on surface of the first doped layer 601 and the epitaxial layer can be doped as n-type to form the fourth doped layer 610.

In the other embodiment of this invention, in case the bonding layer is formed with metal layer, the bonding layer 560 can act as increasing the doped layer of the first doped layer 610 of the surface of the semiconductor substrate.

In the other embodiment of this invention, instead of adding the fourth doped layer 610 on the surface of the first doped layer 601, phosphorus ion which has small ion size can be ion-implanted in a pre-defined depth from the surface of the semiconductor substrate to form thicker n-type doped layer.

A detaching layer 605 is formed in between the third doped layer 603 and the single crystalline semiconductor substrate 607. The detaching layer 605 is formed as porous layer, dielectric film such as oxide or nitride, organic bonding layer or strained layer by the crystalline dislocation of the substrate (such as SiGe).

One of the well-known to the skilled in the art technology is ion-implanting Hydrogen gas into the wafer to form the detaching layer, and this technology is called as exfoliating implant technology.

The role of the detaching layer 605 to protect the doped layers 600 not to be removed when removing the single crystalline semiconductor substrate after bonding the second semiconductor wafer on the bonding layer 560. Also, the detaching layer 600 can help clear and easy detaching of the single crystalline semiconductor substrate 607 while only remaining the doped layers 600.

Figure 23:
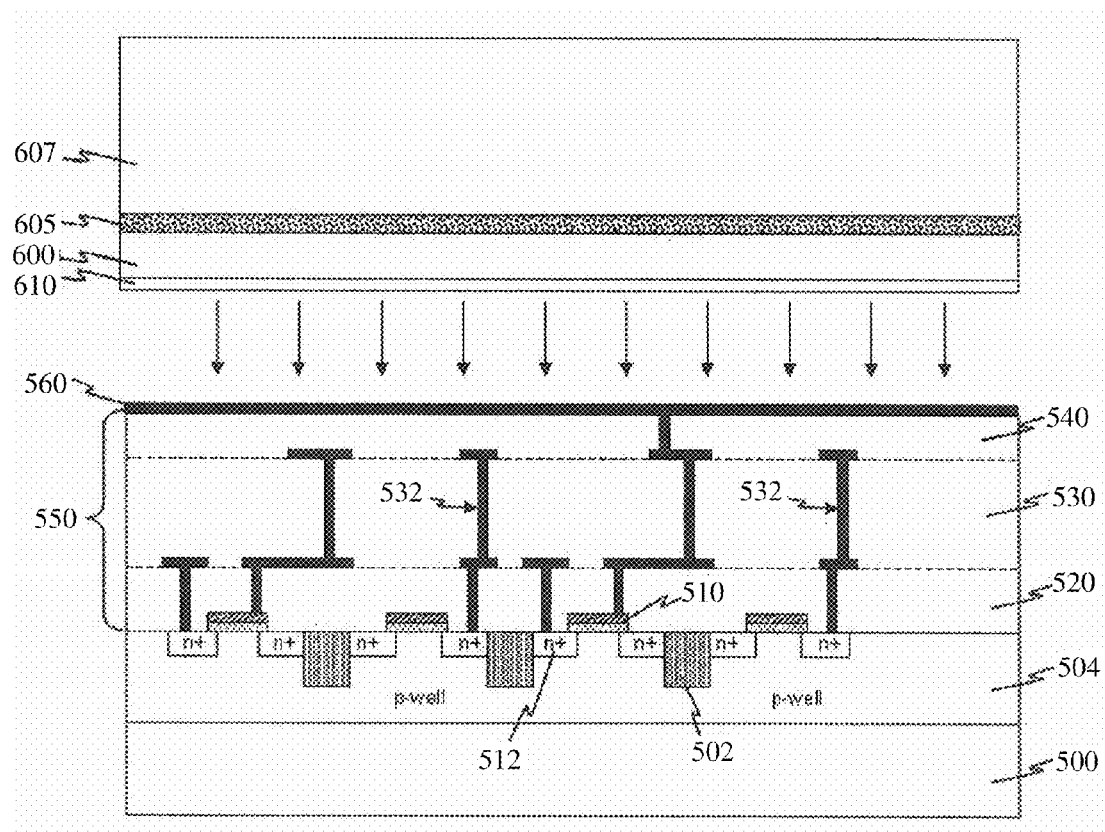

FIG. 23 illustrates bonding process between the surface of the multiple doped layer 600, 610 and the bonding layer 560 to bond the single crystalline semiconductor substrate 607. Specifically, the surface of the fourth doped layer 610 is bonded to the surface of the bonding layer 560.

During the bonding process, a heat treatment and compression can be added to increase bonding strength.

It should be noted that there is no accurate alignment required when bonding the single crystalline semiconductor substrate 607 on the bonding layer 560, because there are no semiconductor devices yet formed on the single crystalline semiconductor substrate 607.

Figure 24:
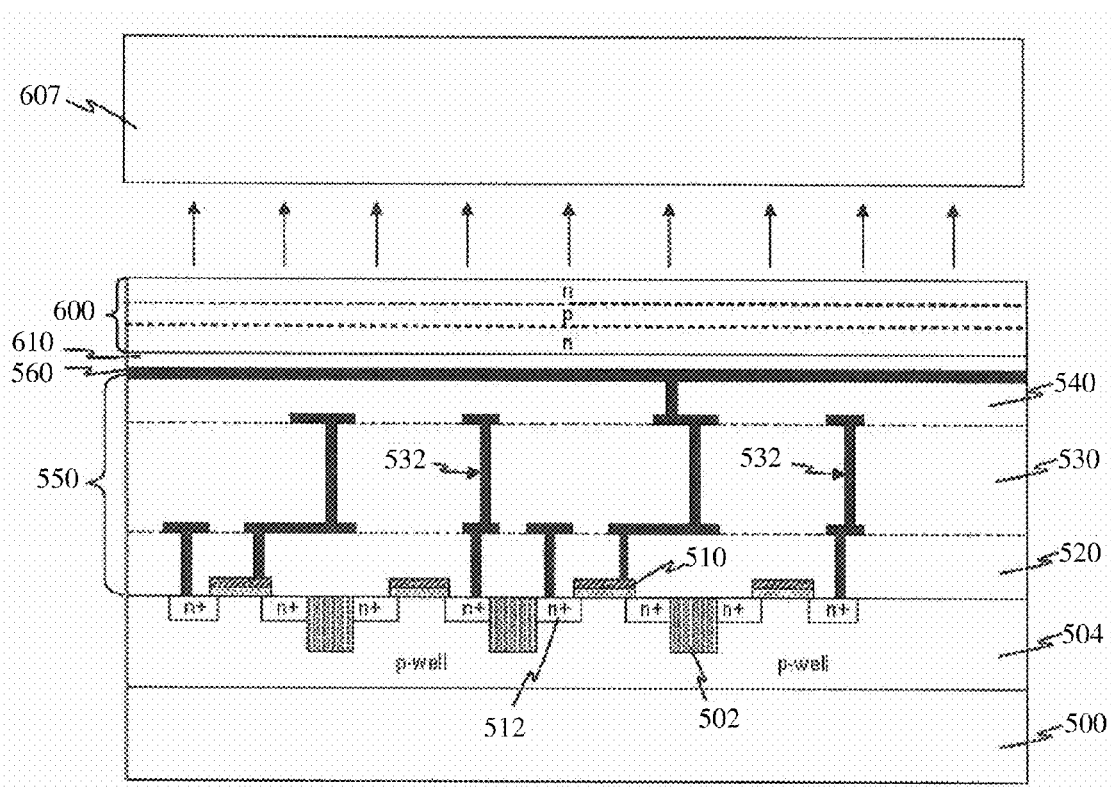

FIG. 24 illustrates removing process of the single crystalline semiconductor substrate 607 after bonding.

Specifically, after bonding, the surface of the single crystalline semiconductor substrate 607 is grinded, polished, or etched until the detaching layer 605 is exposed. After the detaching layer 605 is exposed, anisotropic or isotropic etch process is performed to expose the multiple doped layers 600, that is, n-type doped layer 603 is exposed.

Exposing the multiple doped layers 600 can be performed because the doped layers 600 and detaching layer 605 are formed with different film material or formed with same material but with different film density. Or, in other embodiment of this invention, the detaching layer 605 can be formed with a weak crystalline lattice structure film. In this case, the single crystalline semiconductor substrate 607 and the multiple doped layer 600 by adding physical shock to the detaching layer 605 to create crack along with the detaching layer 605.

In other embodiment of this invention, the single crystalline semiconductor substrate 607 can be provided with glass wafer as a medium. In this embodiment, the multiple doped layer 600 can be formed on the glass wafer, and then transferred to another semiconductor substrate, as two step processes.

As explained, by bonding the single crystalline semiconductor substrate 607 which includes multiply doped layer 600 to the bonding layer 560, and then removing the single crystalline semiconductor substrate 607 excluding the multiply doped layer 600, the multiply doped layer 600, 601 can be formed on the bonding layer 560.

Finally, the fourth doped layer 610 is formed on the surface of the bonding layer 560, and the first, second and third doped layer is formed in order on the fourth doped layer. The fourth doped layer 610 and the first doped layer 601 are n-type doped layers and formed on the bonding layer 560. This allows to form a thick n-type doped layer on the bonding layer 560.

Figure 25:
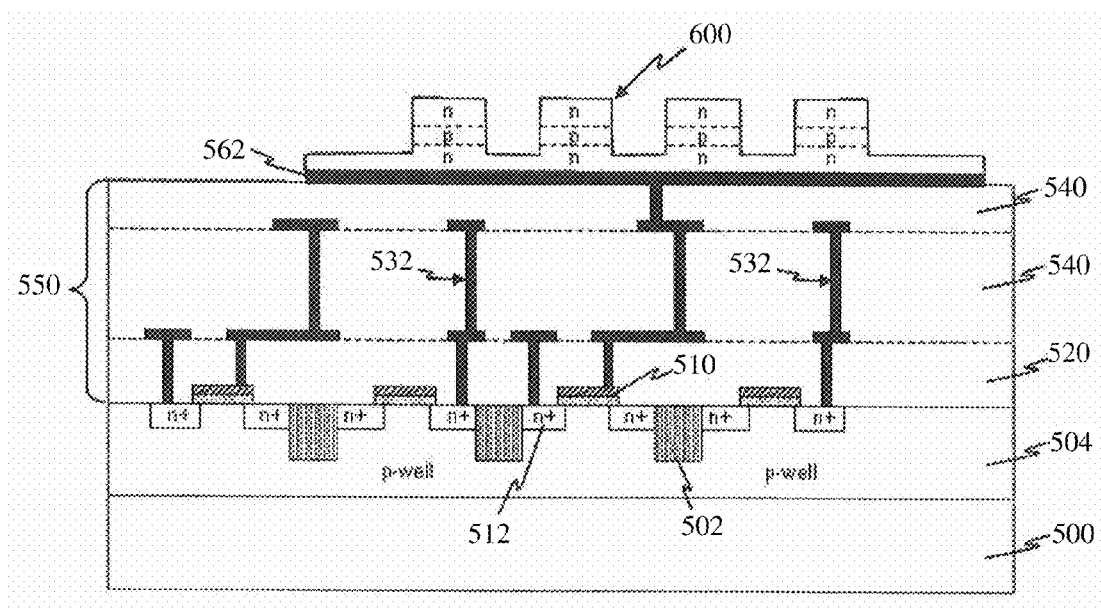

FIG. 25 illustrates formation of transistors by patterning the multiple doped layers 600, in accordance with this invention.

Firstly, etch mask (not illustrate) is formed on the multiple doped layer 600 for patterning the doped layers 610, 600. The etch mask can be formed by coating photoresist and patterning the photoresist.

And then, the multiple doped layers 600, 610 and the bonding layer 560 is patterned using the etch mask. Specifically, the multiple doped layers and the bonding layers are etched until the third interlayer dielectric film 540 is exposed.

The patterning process of the multiple doped layers 610, 600 can be performed multiple times in accordance with the required semiconductor device characteristics.

As illustrated in FIG. 25, in one embodiment of this invention, the multiple doped layers 600 is patterned to have pillar shape to become multiple doped layer patterns 600'. The each of the multiple doped layer patterns 600' has n/p/n structure, wherein the n-type doped layer on the bonding layer pattern 562 is comprised of the first and fourth doped layers. Specifically, the n-type doped layer on the bonding layer pattern 562 has thicker thickness comparing to the thickness of the p-type or n-type doped layers in the upper side of the pattern. Also, the n-type doped layers on the bonding layer pattern 562 can be electrically connected. This forms channel region and source/drain region of the vertically channeled transistors or vertical transistors. In case the bonding layer pattern 562 is formed with electrically conducting material, the bonding layer pattern 562 can be used as contact pad for connecting contacts 532 in the lower region and the vertically transistors.

Following steps, as illustrated in FIGS. 26a, 26b, 26c, 26d and 26e, gate dielectric film and gate conductor is formed around the pillar shaped doped layer patterns 600'.

Figure 26A:
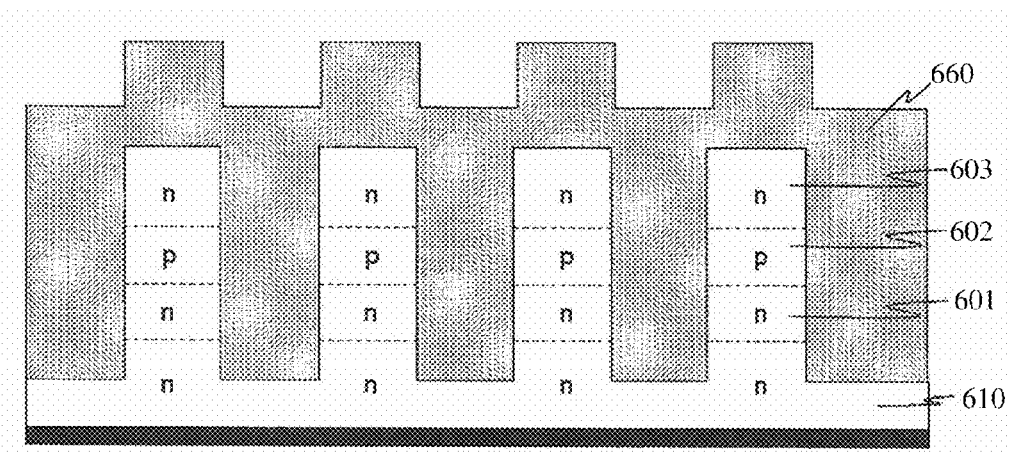
FIGS. 26a, 26b, 26c, 26d and 26e are sectional views of processing a semiconductor structure which includes a mesa structure.

In FIG. 26a, the first, third and fourth doped layers 601', 603', 610' can be provided as source/drain region, and the second doped layer 602' can be provided as channel region. In this case, the first and fourth doped layers 601', 610' can be provided as one source/drain region.

After forming the pillar shaped doped layer patterns, the gate dielectric film 620 is deposited on and conformal to the pillar shaped doped layer patterns 601', 602', 603', 610'. The gate dielectric film 620 in are thickly deposited to reduce parasitic capacitance and/or leakage current. Specifically, the gate dielectric film 620 is deposited to completely cover the pillar shaped doped layer patterns 601', 602', 603', 610' as illustrated in FIG. 26a.

Figure 26B:
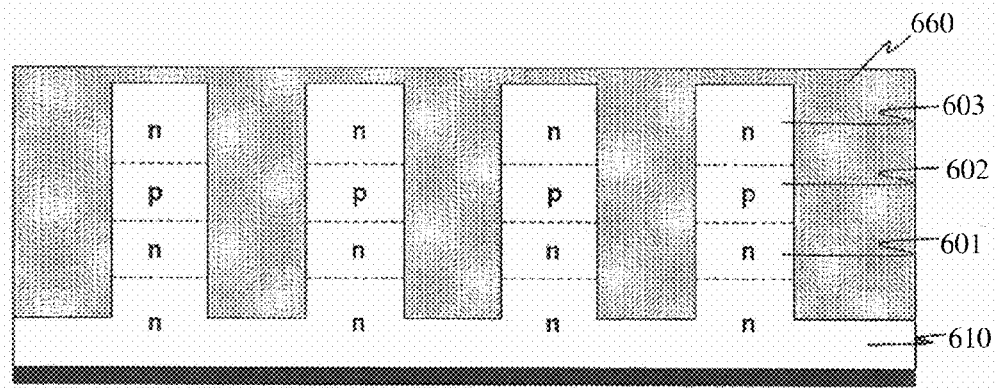

As illustrated in FIG. 26b, a planarization process such as CMP (Chemical-Mechanical Polishing) can be performed to planarize the surface of the gate dielectric 620. At this planarization process, the top surface of the doped layer patterns 603 can be also exposed.

Figure 26C:
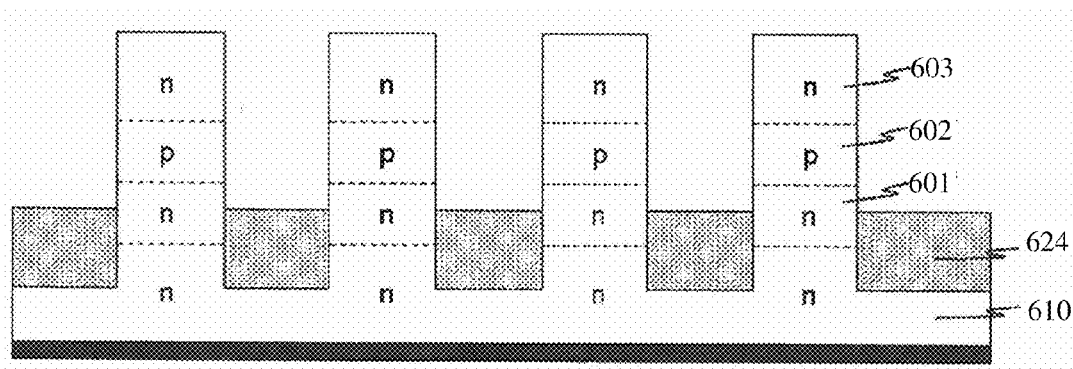

As illustrated in FIG. 26c, a dry etch process is performed on the planarized gate dielectric film 622 until remaining only pre-defined thickness of the gate dielectric film 624 among the doped layer patterns 601', 602', 603', 610'. The surface of the remaining gate dielectric film 624 can be remained above the fourth doped layer pattern 610'. Finally, the gate dielectric film 624 is formed on top and around the fourth dope layer pattern 601'.

It should be noted that the method of forming the gate dielectric film 624 is not limited as the method of this embodiment of the invention, but can be formed by other method known to the skilled in the art.

Figure 26D:
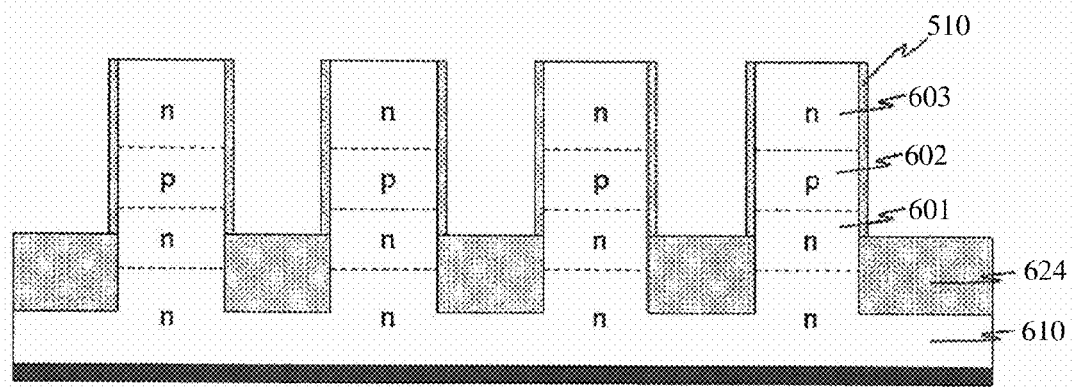

The FIG. 26d illustrates formation of the thin vertical gate dielectric film 632 around the side walls of the doped layer patterns 601', 602', 603', 610'. The role of the vertical gate dielectric film 632 is to control electrical charge between gate electrode (not illustrated) and channel regions. The vertical gate dielectric film 632 can be formed with oxide only, or can be formed with stacked film structure such as Oxide-Nitride-Oxide which can store electric charges. Also, a floating gate can be formed additionally on the gate dielectric film.

Figure 26E:
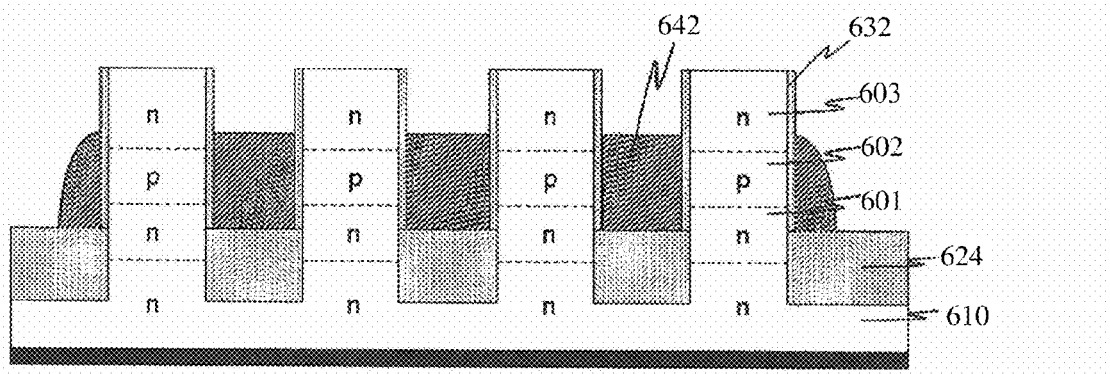

FIG. 26e illustrates the formation of the gate electrode 642 on the horizontal and vertical gate dielectric film 624, 632. Specifically, a gate conductor film is deposited to cover the horizontal and vertical gate dielectric film 624, 632 and the doped layer patterns 603'. And then the gate conductor film is anisotropic etched to form the gate electrode 642 which surrounds the pillar shaped doped layer patterns 601', 602', 603', 610' as illustrated. It should be noted that the gate electrode 642 surrounds the pillar shaped doped layer patterns 601', 602', 603', 610' so that the gate electrode 642 can form a word-line.

Figure 27:
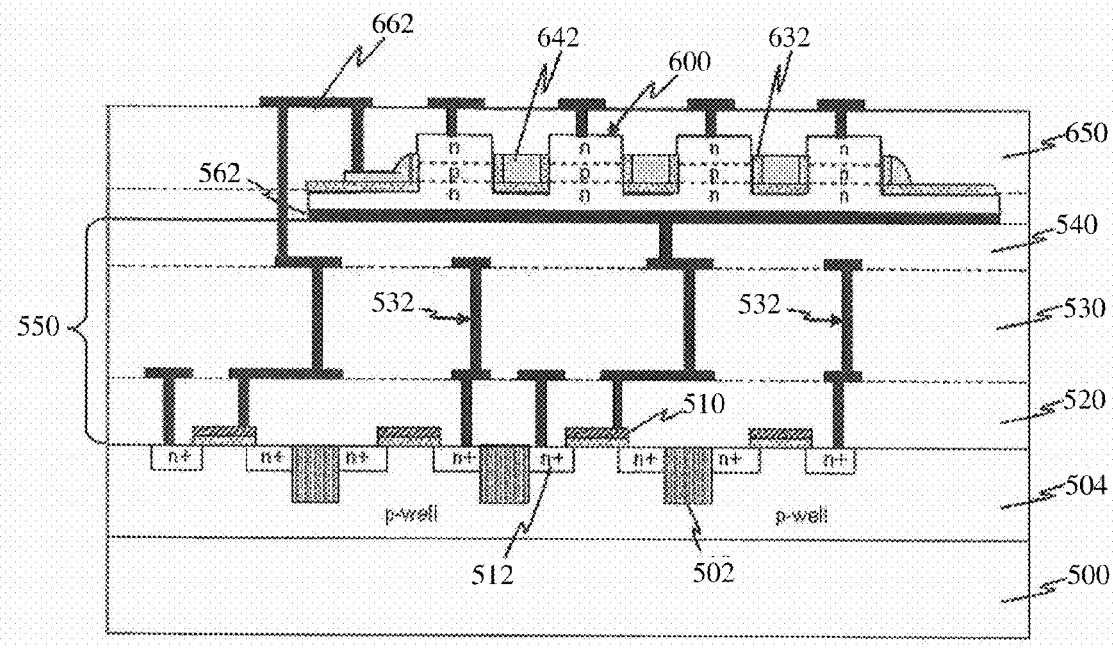
FIG. 27 is a sectional view of a bonded semiconductor structure which includes the mesa structure of FIG. 26e.

As illustrated in FIG. 27, after forming the gate electrode 642, a fifth interlayer dielectric film 650 is formed to completely covers the vertical transistors. And then contacts and wirings 662 are formed in the fifth interlayer dielectric film 650. Part of the contacts and wiring 662 can be electrically connected to the semiconductor devices in the upper region of the first semiconductor substrate 500.

Parasitic capacitance can be induced by contacting gate electrode 642 to doped layer other than channel region in vertical transistor structure. It should be noted that, in this embodiment of the invention, the parasitic capacitance can be prevented or reduced by forming thick n-type doped layer of the vertical transistor in accordance with this invention. Also, leakage current between the gate electrode 642 and the doped layers 610' can be reduced by forming thick horizontal gate dielectric film 624.

While particular embodiments of the invention have been shown and described, numerous variations and alternate embodiments will occur to those skilled in the art. Accordingly, it is intended that the invention be limited only in terms of the appended claims.

The invention claimed is:

1. A method, comprising:

forming a switching device which includes a vertical channel spaced from a semiconductor substrate; and forming first and second storage devices which are positioned on opposed sides of the switching device, wherein the storage devices each include a cylindrically shaped storage node, a plate electrode coupled to the storage node, and a dielectric film which is formed between the storage node and plate electrode, the storage nodes being electrically connected to the switching device.

2. The method of claim 1, wherein the step of forming the switching device includes forming a mesa structure.

3. The method of claim 2, wherein the step of forming the switching device includes forming a gate electrode which extends around the mesa structure.

4. The method of claim 3, wherein the step of forming the switching device includes forming a dielectric film which extends around the mesa structure.

5. The method of claim 3, wherein the step of forming the switching device includes forming single crystalline semiconductor.

* * * * *